United States Patent
Lin et al.

(10) Patent No.: US 12,550,402 B2
(45) Date of Patent: Feb. 10, 2026

(54) NANOSTRUCTURE FIELD-EFFECT TRANSISTOR DEVICE AND METHOD OF FORMING

(71) Applicant: Taiwan Semiconductor Manufacturing Co., Ltd., Hsinchu (TW)

(72) Inventors: Wen-Kai Lin, Yilan County (TW); Te-En Cheng, Taoyuan (TW); Che-Hao Chang, Hsinchu (TW); Chi On Chui, Hsinchu (TW); Yung-Cheng Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 586 days.

(21) Appl. No.: 17/666,026

(22) Filed: Feb. 7, 2022

(65) Prior Publication Data

US 2023/0045665 A1 Feb. 9, 2023

Related U.S. Application Data

(60) Provisional application No. 63/229,611, filed on Aug. 5, 2021.

(51) Int. Cl.
*H10D 64/01* (2025.01)
*H01L 21/02* (2006.01)
(Continued)

(52) U.S. Cl.
CPC ....... *H10D 64/018* (2025.01); *H01L 21/0259* (2013.01); *H10D 30/031* (2025.01);
(Continued)

(58) Field of Classification Search
CPC . B82Y 10/00; H01L 21/02126; H01L 21/022; H01L 21/02274; H01L 21/0228;
(Continued)

(56) References Cited

U.S. PATENT DOCUMENTS

| 8,487,378 B2 | 7/2013 | Goto et al. |
| 8,729,634 B2 | 5/2014 | Shen et al. |

(Continued)

FOREIGN PATENT DOCUMENTS

| CN | 113206085 A | 8/2021 |
| KR | 20170132071 A | 12/2017 |

(Continued)

*Primary Examiner* — Mark W Tornow
*Assistant Examiner* — Priya M Rampersaud
(74) *Attorney, Agent, or Firm* — Slater Matsil, LLP

(57) ABSTRACT

A method of forming a semiconductor device includes: forming a dummy gate structure over a fin structure that protrudes above a substrate, where the fin structure includes a fin and a layer stack over the fin, where the layer stack comprises alternating layers of a first semiconductor material and a second semiconductor material; forming openings in the fin structure on opposing sides of the dummy gate structure, where the openings exposes first portions of the first semiconductor material and second portions of the second semiconductor material; recessing the exposed first portions of the first semiconductor material to form sidewall recesses in the first semiconductor material; lining the sidewall recesses with a first dielectric material; depositing a second dielectric material in the sidewall recesses on the first dielectric material; after depositing the second dielectric material, annealing the second dielectric material; and after the annealing, forming source/drain regions in the openings.

20 Claims, 16 Drawing Sheets

(51) Int. Cl.
*H10D 30/01* (2025.01)
*H10D 30/67* (2025.01)
*H10D 62/10* (2025.01)

(52) U.S. Cl.
CPC ..... *H10D 30/6735* (2025.01); *H10D 30/6757* (2025.01); *H10D 62/118* (2025.01); *H10D 64/017* (2025.01)

(58) Field of Classification Search
CPC ........... H01L 21/02318; H01L 21/0259; H01L 21/3105; H01L 29/0653; H01L 29/0665; H01L 29/0673; H01L 29/0847; H01L 29/165; H01L 29/42392; H01L 29/66439; H01L 29/66545; H01L 29/66553; H01L 29/6656; H01L 29/775; H01L 29/7848; H01L 29/78696; H01L 21/02603; H01L 21/02532; H01L 21/0245; H01L 21/764; H10D 30/6735; H10D 30/6757; H10D 62/118; H10D 64/017; H10D 64/018; H10D 62/121; H10D 30/797; H10D 62/116; H10D 84/038; H10D 64/021; H10D 64/679; H10D 30/62; H10D 30/024; H10D 84/0158; H10D 30/6713; H10D 84/834; H10D 62/115; H10D 62/119; H10D 86/215; Y10S 977/762; Y10S 977/938

See application file for complete search history.

(56) References Cited

U.S. PATENT DOCUMENTS

| | | | |
|---|---|---|---|
| 8,826,213 | B1 | 9/2014 | Ho et al. |
| 8,887,106 | B2 | 11/2014 | Ho et al. |
| 9,905,672 | B2 | 2/2018 | Wang et al. |
| 10,903,317 | B1* | 1/2021 | Frougier ............... H10D 30/014 |
| 10,950,731 | B1 | 3/2021 | Peng et al. |
| 11,393,711 | B2 | 7/2022 | Kao et al. |
| 11,901,439 | B2 | 2/2024 | Lin et al. |
| 2014/0282326 | A1 | 9/2014 | Chen et al. |
| 2017/0069763 | A1* | 3/2017 | Doris ................. H01L 29/42392 |
| 2018/0337100 | A1 | 11/2018 | Lee et al. |
| 2019/0067441 | A1* | 2/2019 | Yang .................... H01L 29/4908 |
| 2019/0131431 | A1* | 5/2019 | Cheng ................ H01L 29/66439 |
| 2020/0105929 | A1 | 4/2020 | Zhang et al. |
| 2020/0381545 | A1 | 12/2020 | Chiang et al. |
| 2021/0043727 | A1 | 2/2021 | Frougier et al. |
| 2021/0126106 | A1 | 4/2021 | Wang et al. |
| 2021/0202758 | A1* | 7/2021 | Yeong ................... H01L 29/775 |
| 2021/0234017 | A1 | 7/2021 | Yao et al. |
| 2021/0376119 | A1* | 12/2021 | Wang .................... H10D 30/023 |
| 2021/0391466 | A1* | 12/2021 | Yeong ................. H10D 64/017 |
| 2022/0123152 | A1 | 4/2022 | Abhijith ............. H10D 30/6713 |
| 2022/0336636 | A1* | 10/2022 | Liu ....................... H10D 62/121 |
| 2022/0376088 | A1 | 11/2022 | Lin et al. |
| 2023/0029232 | A1* | 1/2023 | Cheng ................. H10D 62/121 |

FOREIGN PATENT DOCUMENTS

| | | |
|---|---|---|
| KR | 20200060678 A | 6/2020 |
| KR | 20210086942 A | 7/2021 |

* cited by examiner

NANOSTRUCTURE FIELD-EFFECT TRANSISTOR DEVICE AND METHOD OF FORMING

PRIORITY CLAIM AND CROSS-REFERENCE

This application claims the benefit of U.S. Provisional Application No. 63/229,611, filed on Aug. 5, 2021 and entitled "Bi-Layer Low k Spacer and Seamless Gap Fill New Design by ALD Process Under GAA Inner Spacer Application," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
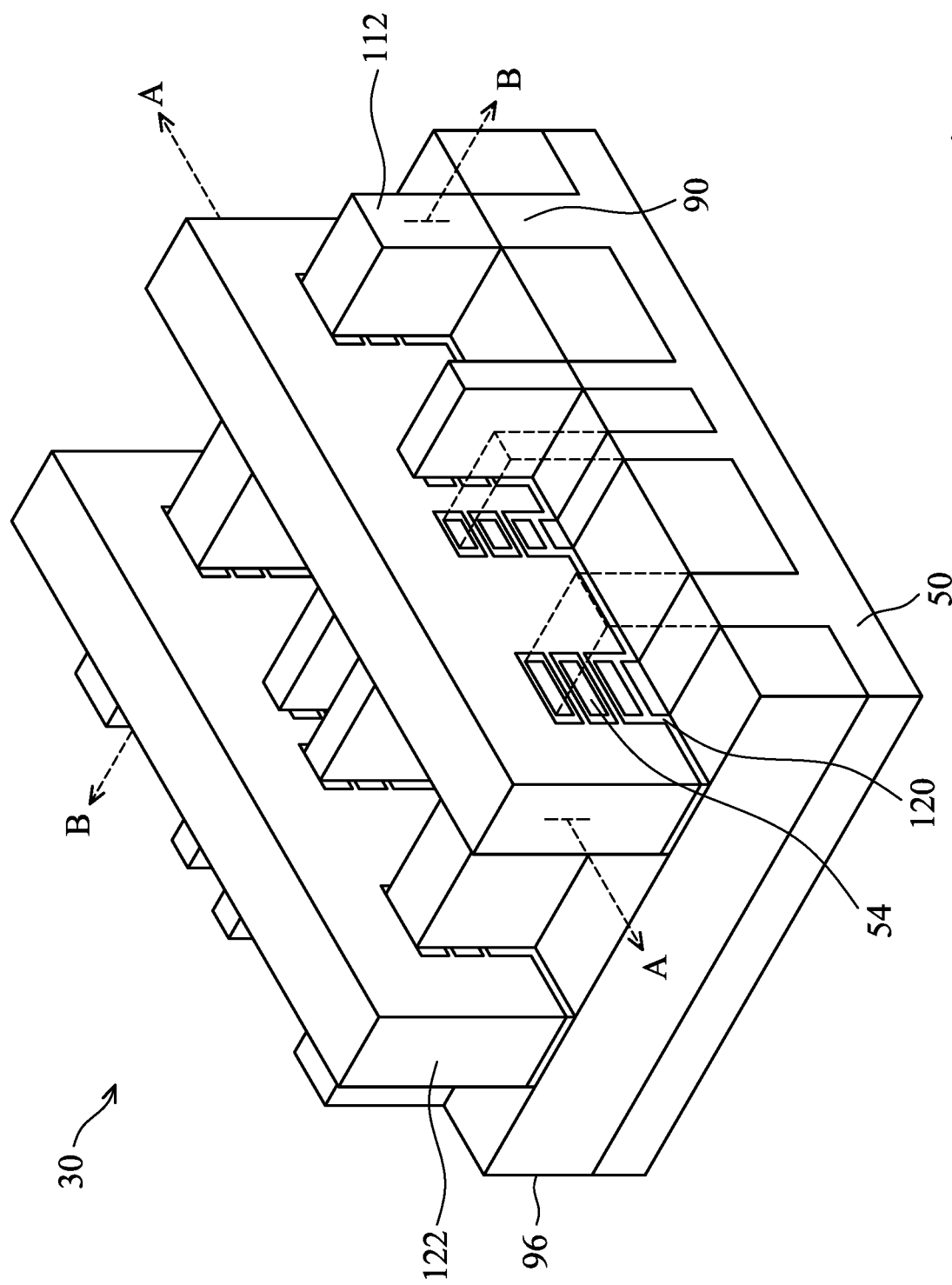
FIG. 1 illustrates an example of a nanostructure field-effect transistor (NSFET) device in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numerals in different figures refer to the same or similar component formed by a same or similar process using a same or similar material(s).

In accordance with some embodiments, to form the inner spacers of a nanostructure field-effect transistor (NSFET) device, a multi-layer spacer film is formed to fill the sidewall recesses in a first semiconductor material, where the first semiconductor material is in a layer stack that includes alternating layers of the first semiconductor material and a second semiconductor material. The multi-layer spacer film includes a first dielectric layer lining the sidewall recesses and a second dielectric layer on the first dielectric layer. The first dielectric layer has a higher dielectric constant than the second dielectric layer. After the second dielectric layer is formed, a multi-step annealing process is performed to remove seams (e.g., air gaps) in the multi-layer spacer film. The multi-layer spacer film is then trimmed to form the inner spacers of the NSFET device. The multi-layer inner spacers achieve a good balance between dielectric constant and etch resistance, such that the NSFET device has lower parasitic capacitance while the inner spacers have a high etch resistance to prevent electrical short (e.g., caused by etching through of the inner spacers) between source/drain regions and the gate structure of the NSFET device.

FIG. 1 illustrates an example of a nanostructure field-effect transistor (NSFET) device 30 in a three-dimensional view, in accordance with some embodiments. The NSFET device 30 comprises semiconductor fins 90 (also referred to as fins) protruding above a substrate 50. A gate electrode 122 (e.g., a metal gate) is disposed over the fins, and source/drain regions 112 are formed on opposing sides of the gate electrode 122. A plurality of nanostructures 54 (e.g., nanowires, or nanosheets) are formed over the fins 90 and between source/drain regions 112. Isolation regions 96 are formed on opposing sides of the fins 90. A gate dielectric layer 120 is formed around the nanostructures 54. Gate electrodes 122 are over and around the gate dielectric layer 120.

FIG. 1 further illustrates reference cross-sections that are used in later figures. Cross-section A-A is along a longitudinal axis of a gate electrode 122 and in a direction, for example, perpendicular to the direction of current flow between the source/drain regions 112 of the NSFET device 30. Cross-section B-B is perpendicular to cross-section A-A and is along a longitudinal axis of a fin 90 and in a direction of, for example, a current flow between the source/drain regions 112 of the NSFET device 30. Subsequent figures refer to these reference cross-sections for clarity.

FIGS. 2, 3A, 3B, 4A, 4B, 5A, 5B, 6-13, and 15-19 are cross-sectional views of a nanostructure field-effect transistor (NSFET) device at various stages of manufacturing, in accordance with an embodiment. In the discussion herein, figures with the same numeral but different alphabets (e.g., FIGS. 5A and 5B) illustrate different views of the same device at the same stage of manufacturing.

Figure 2:
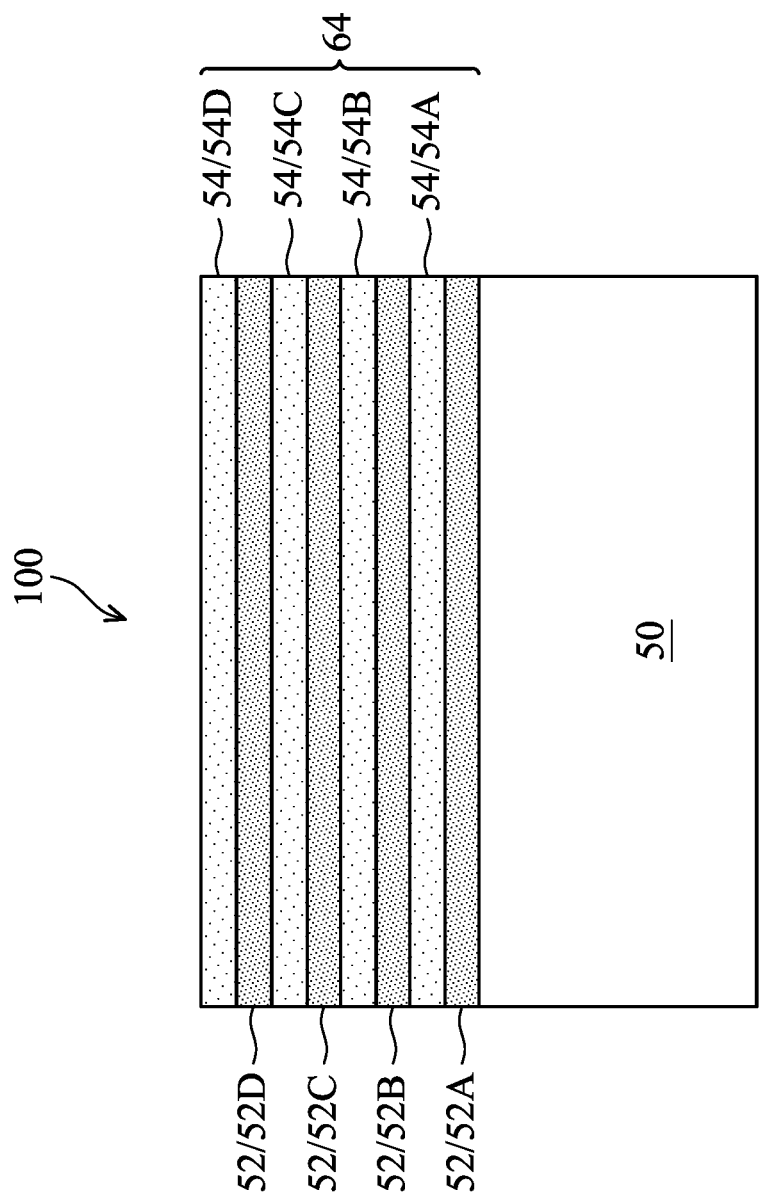
FIGS. 2, 3A, 3B, 4A, 4B, 5A, 5B, 6-13, and 15-19 are cross-sectional views of a nanostructure field-effect transistor (NSFET) device at various stages of manufacturing, in accordance with an embodiment.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

An epitaxial material stack 64 is formed on the substrate 50. The epitaxial material stack 64 includes alternating layers of a first semiconductor material 52 and a second semiconductor material 54. In FIG. 2, layers formed by the first semiconductor material 52 are labeled as 52A, 52B, 52C, and 52D, and layers formed by the second semiconductor material 54 are labeled as 54A, 54B, 54C, and 54D. The number of layers formed by the first and the second semiconductor materials illustrated in FIG. 2 are merely non-limiting examples. Other numbers of layers are also possible and are fully intended to be included within the scope of the present disclosure.

In some embodiments, the first semiconductor material 52 is an epitaxial material suitable for forming channel regions of, e.g., p-type FETs, such as silicon germanium ($Si_xGe_{1-x}$, where x is in the range of 0 to 1), and the second semiconductor material 54 is an epitaxial material suitable for forming channel regions of, e.g., n-type FETs, such as silicon. The epitaxial material stacks 64 will be patterned to form channel regions of an NSFET in subsequent processing. In particular, the epitaxial material stacks 64 will be patterned to form horizontally extending nanostructures, with the channel regions of the resulting NSFET including multiple horizontally extending nanostructures.

The epitaxial material stacks 64 may be formed by an epitaxial growth process, which may be performed in a growth chamber. During the epitaxial growth process, the growth chamber is cyclically exposed to a first set of precursors for selectively growing the first semiconductor material 52, and then exposed to a second set of precursors for selectively growing the second semiconductor material 54, in some embodiments. The first set of precursors includes precursors for the first semiconductor material (e.g., silicon germanium), and the second set of precursors includes precursors for the second semiconductor material (e.g., silicon). In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing the first semiconductor material 52; and (2) disabling the flow of the germanium precursor to the growth chamber when growing the second semiconductor material 54. The cyclical exposure may be repeated until a target number of layers is formed.

Figure 3B:
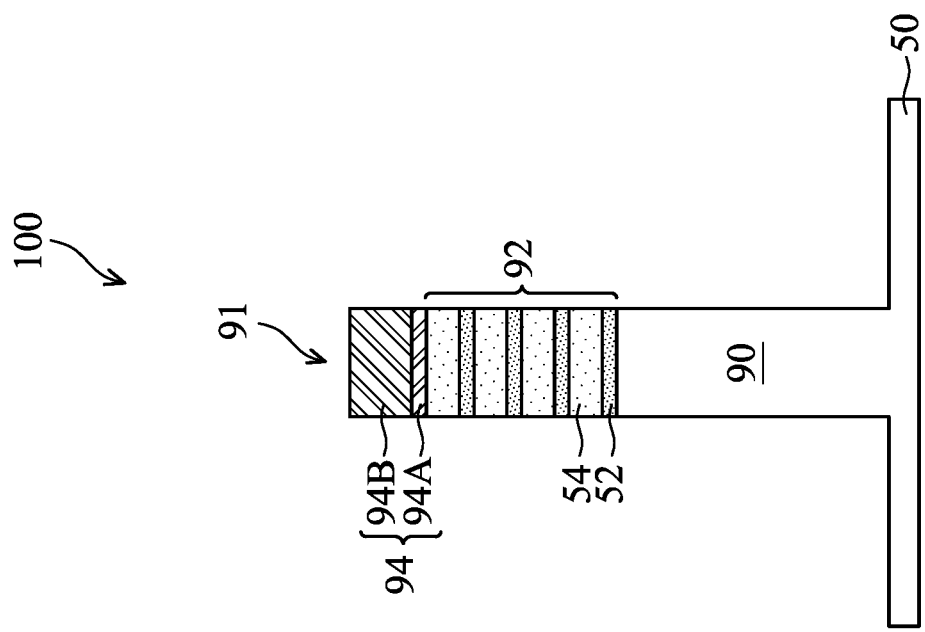
Figure 12:
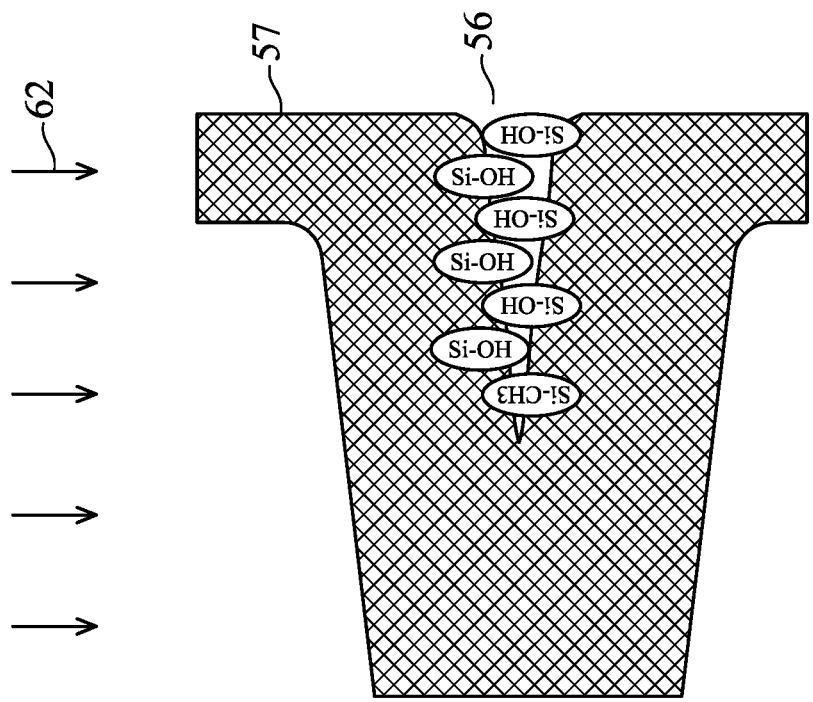
Figures 13, 14:
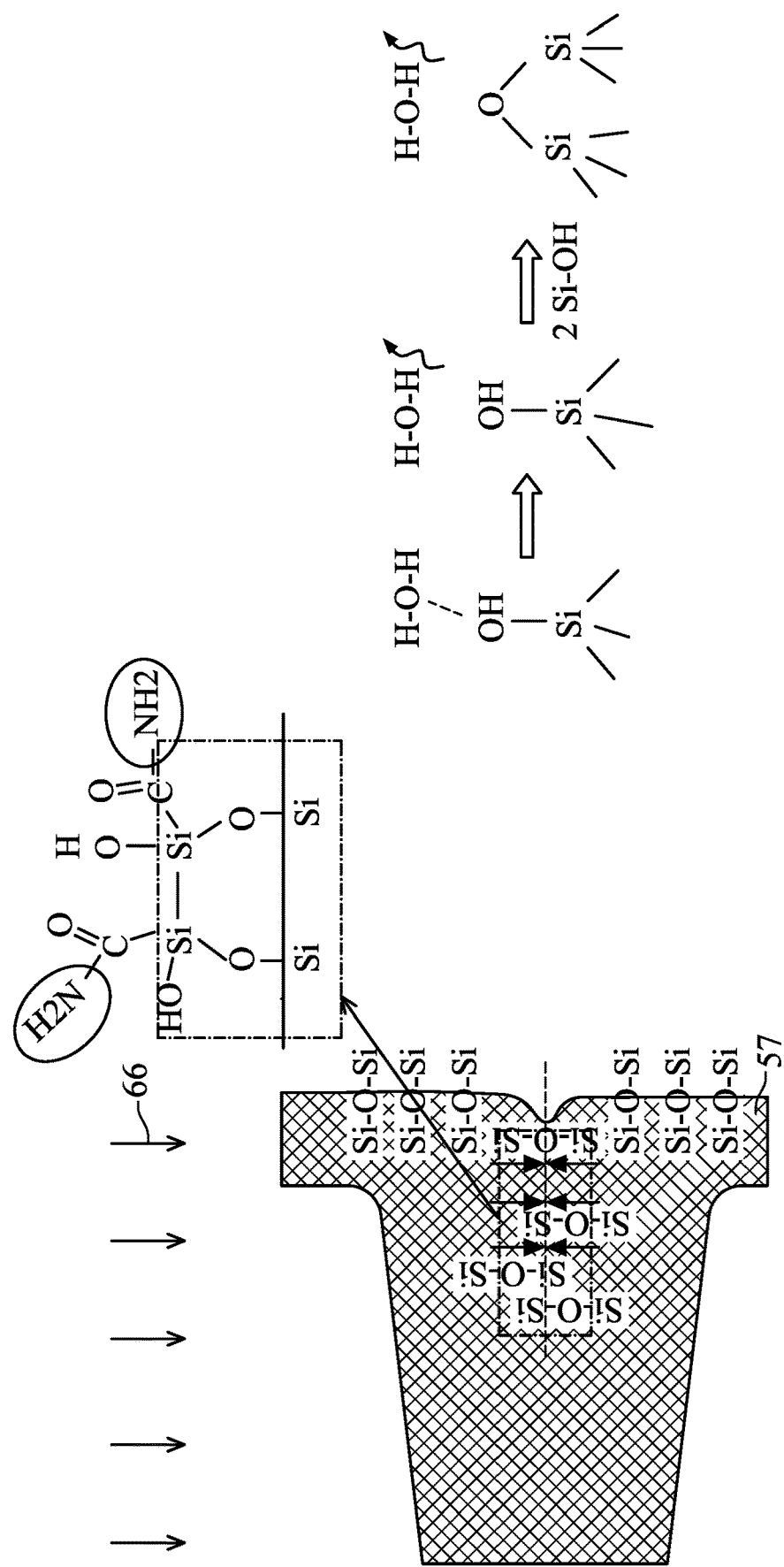
FIG. 14 illustrates the chemical reaction during the processing illustrated in FIG. 13, in an embodiment.

FIGS. 3A, 3B, 4A, 4B, 5A, 5B, 6-13, and 15-19 are cross-sectional views of the NSFET device 100 at subsequent stages of manufacturing, in accordance with an embodiment. FIGS. 3A, 4A, 5A, 6-10, and 15-19 are cross-sectional views along cross-section B-B in FIG. 1. FIGS. 3B, 4B, and 5B are cross-sectional views along cross-section A-A in FIG. 1. FIGS. 11-13 are zoomed-in views of a portion of the NSFET device 100 illustrated in FIG. 10. Although one fin and one gate structure are illustrated in the figures as a non-limiting example, it should be appreciated that other numbers of fins and other numbers of gate structures may also be formed.

Figure 3A:
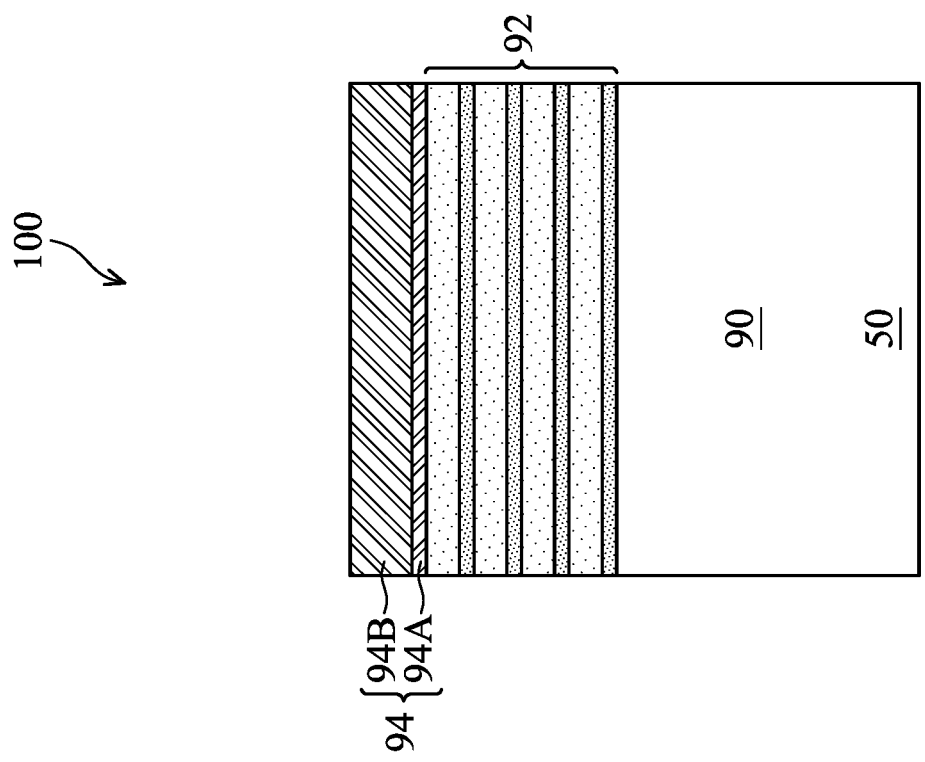
Figure 4B:
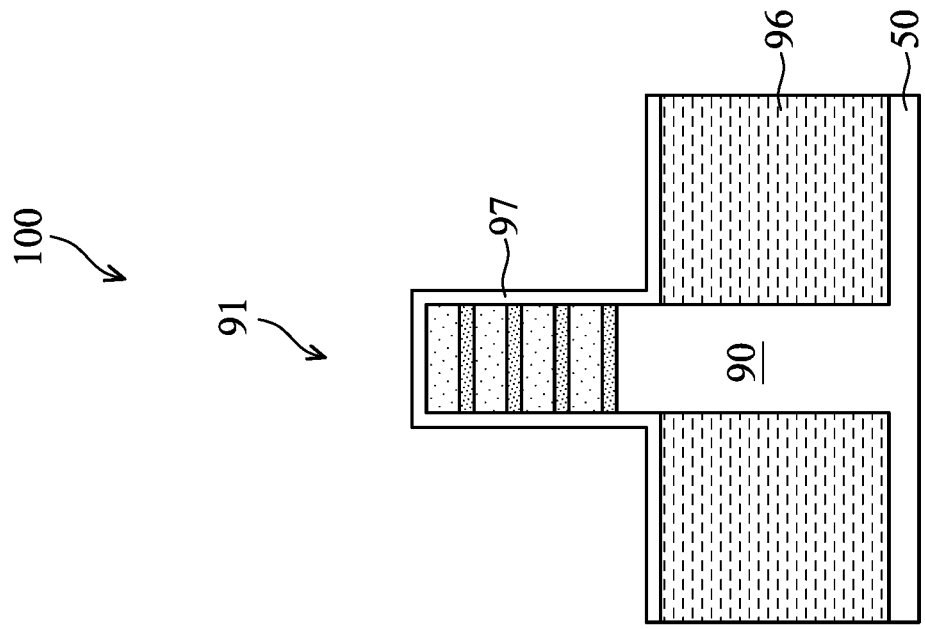

In FIGS. 3A and 3B, a fin structure 91 are formed protruding above the substrate 50. The fin structure 91 includes a semiconductor fin 90 and a layer stack 92 overlying the semiconductor fin 90. The layer stack 92 and the semiconductor fin 90 may be formed by etching trenches in the epitaxial material stack 64 and the substrate 50, respectively.

The fin structure 91 may be patterned by any suitable method. For example, the fin structure 91 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fin structure 91.

In some embodiments, the remaining spacers are used to pattern a mask 94, which is then used to pattern the fin structure 91. The mask 94 may be a single layer mask, or may be a multilayer mask such as a multilayer mask that includes a first mask layer 94A and a second mask layer 94B. The first mask layer 94A and second mask layer 94B may each be formed from a dielectric material such as silicon oxide, silicon nitride, a combination thereof, or the like, and may be deposited or thermally grown according to suitable techniques. The first mask layer 94A and second mask layer 94B are different materials having a high etching selectivity. For example, the first mask layer 94A may be silicon oxide, and the second mask layer 94B may be silicon nitride. The mask 94 may be formed by patterning the first mask layer 94A and the second mask layer 94B using any acceptable etching process. The mask 94 may then be used as an etching mask to etch the substrate 50 and the epitaxial material stack 64. The etching may be any acceptable etch process, such as a reactive ion etch (RIE), neutral beam etch (NBE), the like, or a combination thereof. The etching is an anisotropic etching process, in some embodiments. After the etching process, the patterned epitaxial material stack 64 form the layer stack 92, and the patterned substrate 50 form the semiconductor fin 90, as illustrated in FIGS. 3A and 3B. Therefore, in the illustrated embodiment, the layer stack 92 also includes alternating layers of the first semiconductor material 52 and the second semiconductor material 54, and the semiconductor fin 90 is formed of a same material (e.g., silicon) as the substrate 50.

Figure 4A:
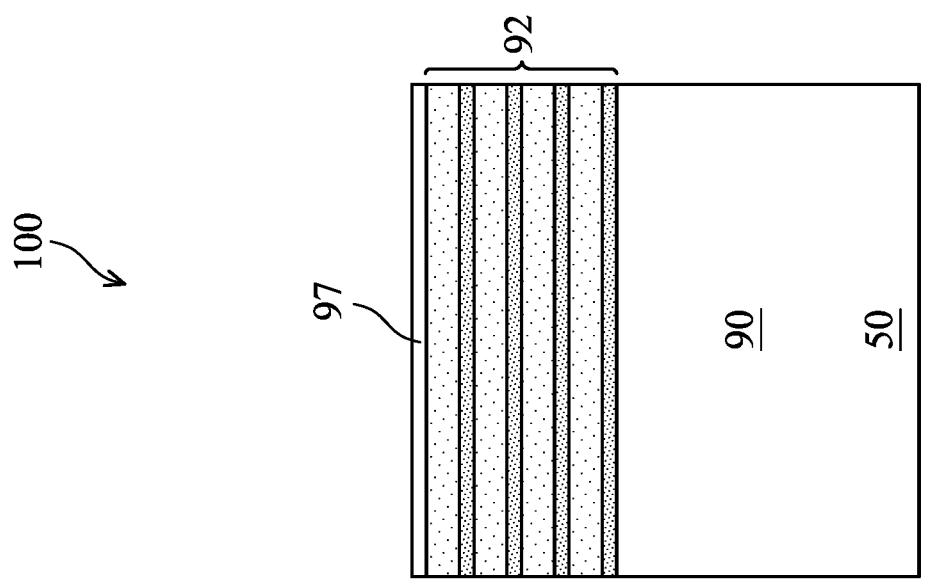
Figure 5B:
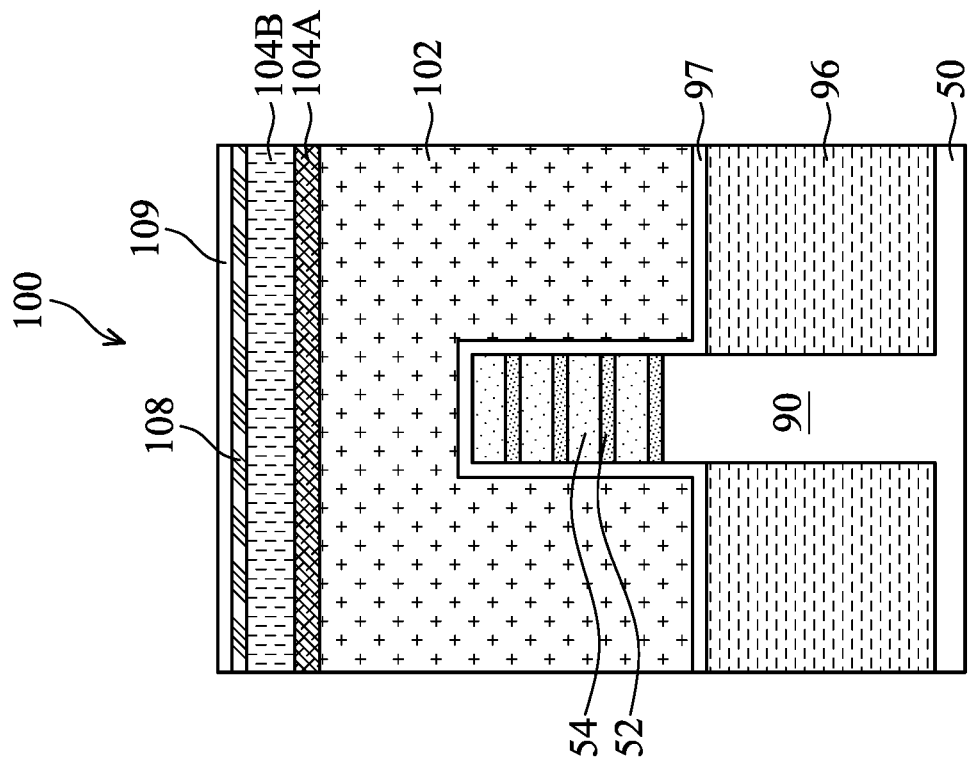

Next, in FIGS. 4A and 4B, Shallow Trench Isolation (STI) regions 96 are formed over the substrate 50 and on opposing sides of the fin structure 91. As an example to form the STI regions 96, an insulation material may be formed over the substrate 50. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed after the insulation material is formed.

In an embodiment, the insulation material is formed such that excess insulation material covers the fin structure 91. In some embodiments, a liner is first formed along surfaces of the substrate 50 and fin structure 91, and a fill material, such as those discussed above is formed over the liner. In some embodiments, the liner is omitted.

Next, a removal process is applied to the insulation material to remove excess insulation material over the fin structure 91. In some embodiments, a planarization process such as a chemical mechanical polish (CMP), an etch back process, combinations thereof, or the like may be utilized. The planarization process exposes the layer stack 92 such that top surfaces of the layer stack 92 and the insulation material are level after the planarization process is complete. Next, the insulation material is recessed to form the STI regions 96. The insulation material is recessed such that the layer stack 92 protrudes from between neighboring STI regions 96. Top portions of the semiconductor fin 90 may also protrude from between neighboring STI regions 96. Further, the top surfaces of the STI regions 96 may have a flat surface as illustrated, a convex surface, a concave surface (such as dishing), or a combination thereof. The top surfaces of the STI regions 96 may be formed flat, convex, and/or concave by an appropriate etch. The STI regions 96 may be recessed using an acceptable etching process, such as one that is selective to the material of the insulation material (e.g., etches the material of the insulation material at a faster rate than the material of the semiconductor fins 90 and the layer stack 92). For example, a chemical oxide removal with a suitable etchant such as dilute hydrofluoric (dHF) acid may be used.

Still referring to FIGS. 4A and 4B, a dummy dielectric layer 97 is formed over the layer stack 92 and over the STI region 96. The dummy dielectric layer 97 may be, for example, silicon oxide, silicon nitride, a combination thereof, or the like, and may be deposited or thermally grown according to acceptable techniques. In an embodiment, a layer of silicon is conformally formed over the layer stack 92 and over the upper surface of the STI regions 96, and a thermal oxidation process is performed to convert the deposited silicon layer into an oxide layer as the dummy dielectric layer 97.

Figure 5A:
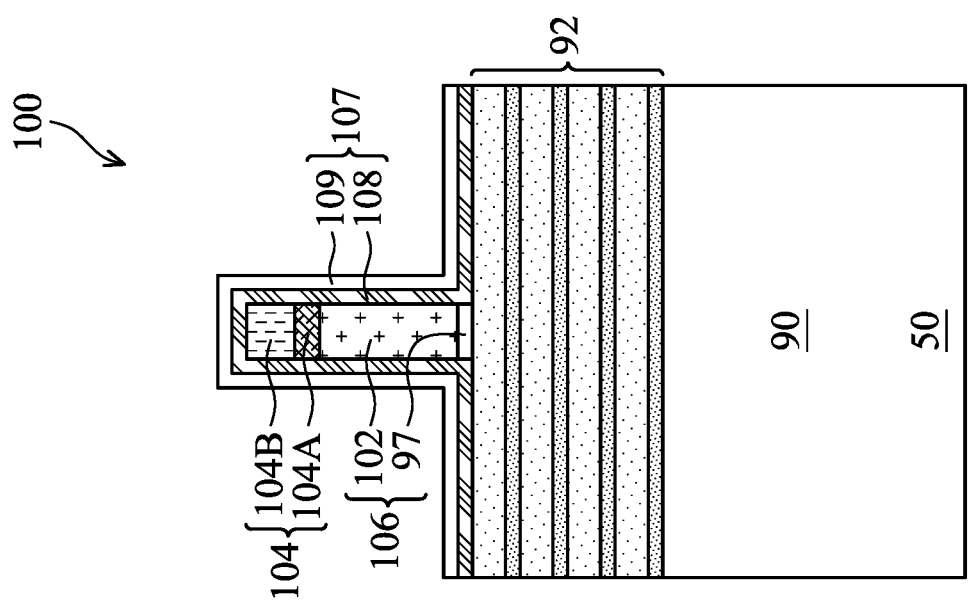

Next, in FIGS. 5A and 5B, a dummy gate 102 are formed over the fin 90 and over the layer stack 92. To form the dummy gate 102, a dummy gate layer may be formed over the dummy dielectric layer 97 and then planarized, such as by a CMP. The dummy gate layer may be a conductive material and may be selected from a group including amorphous silicon, polycrystalline-silicon (polysilicon), polycrystalline silicon-germanium (poly-SiGe), or the like. The dummy gate layer may be deposited by physical vapor deposition (PVD), CVD, sputter deposition, or other techniques. The dummy gate layer may be made of other materials that have a high etching selectivity from the isolation regions 96.

Masks 104 are then formed over the dummy gate layer. The masks 104 may be formed from silicon nitride, silicon oxynitride, combinations thereof, or the like, and may be patterned using acceptable photolithography and etching techniques. In the illustrated embodiment, the mask 104 includes a first mask layer 104A (e.g., a silicon oxide layer) and a second mask layer 104B (e.g., a silicon nitride layer). The pattern of the masks 104 is then transferred to the dummy gate layer by an acceptable etching technique to form the dummy gate 102, and then transferred to the dummy dielectric layer by acceptable etching technique to form dummy gate dielectrics 97. The dummy gate 102 covers respective channel regions of the layer stack 92. The pattern of the masks 104 may be used to physically separate the dummy gate 102 from adjacent dummy gates. The dummy gate 102 may also have a lengthwise direction substantially perpendicular to the lengthwise direction of the fins 90. The dummy gate 102 and the dummy gate dielectric 97 are collectively referred to as a dummy gate structure 106, in some embodiments.

Next, a gate spacer layer 107 is formed by conformally depositing an insulating material over the layer stack 92, the STI regions 96, and the dummy gate 102. The insulating material may be silicon nitride, silicon oxynitride, silicon carbonitride, a combination thereof, or the like. In some embodiments, the gate spacer layer 107 includes multiple sublayers. For example, a first sublayer 108 (sometimes referred to as a gate seal spacer layer) may be formed by thermal oxidation or a deposition, and a second sublayer 109 (sometimes referred to as a main gate spacer layer) may be conformally deposited on the first sublayer 108. FIG. 5B illustrates cross-sectional views of the NSFET device 100 in FIG. 5A, but along cross-section A-A in FIG. 1.

Figure 6:
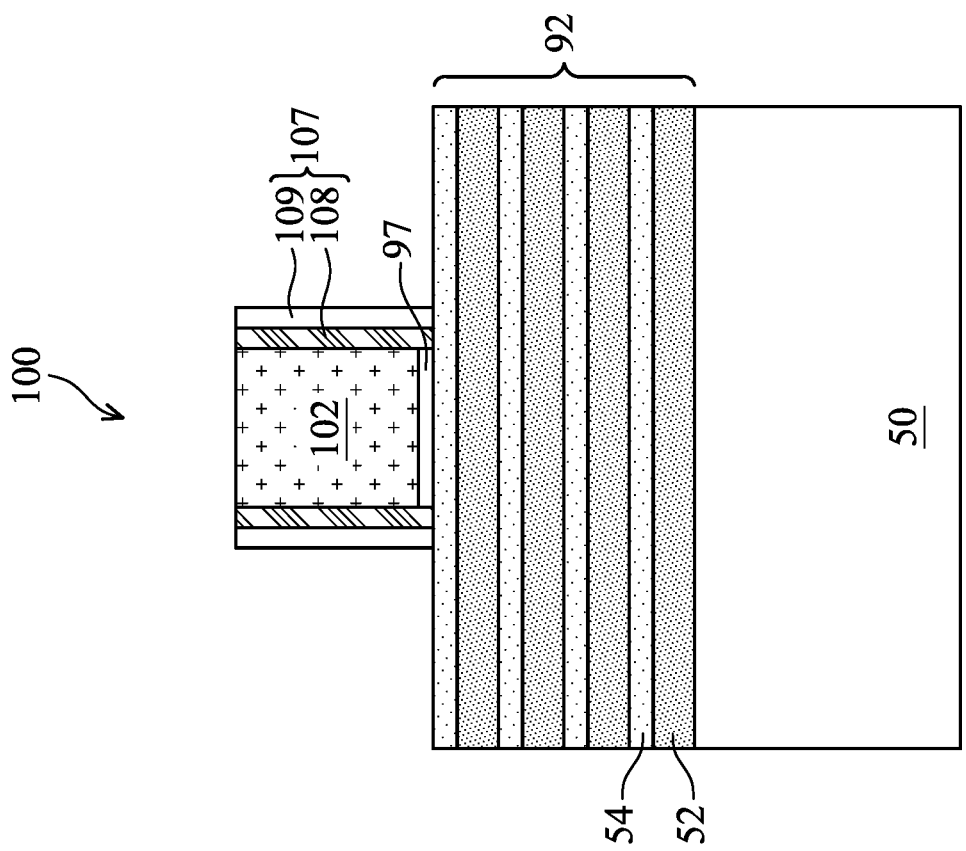

Next, in FIG. 6, the gate spacer layer 107 is etched by an anisotropic etching process to form gate spacers 107. The anisotropic etching process may remove horizontal portions of the gate spacer layer 107 (e.g., portions over the layer stack 92, the STI regions 96 and the dummy gate 102), with remaining vertical portions of the gate spacer layer 107 (e.g., along sidewalls of the dummy gate 102 and the dummy gate dielectric 97) forming the gate spacers 107.

After the formation of the gate spacers 107, implantation for lightly doped source/drain (LDD) regions (not shown) may be performed. Appropriate type (e.g., p-type or n-type) impurities may be implanted into the exposed layer stack 92 and/or the semiconductor fin 90. The n-type impurities may be the any suitable n-type impurities, such as phosphorus, arsenic, antimony, or the like, and the p-type impurities may be the any suitable p-type impurities, such as boron, $BF_2$, indium, or the like. The lightly doped source/drain regions may have a concentration of impurities of from about $10^{15}$ $cm^{-3}$ to about $10^{16}$ $cm^{-3}$. An anneal process may be used to activate the implanted impurities.

Figure 7:
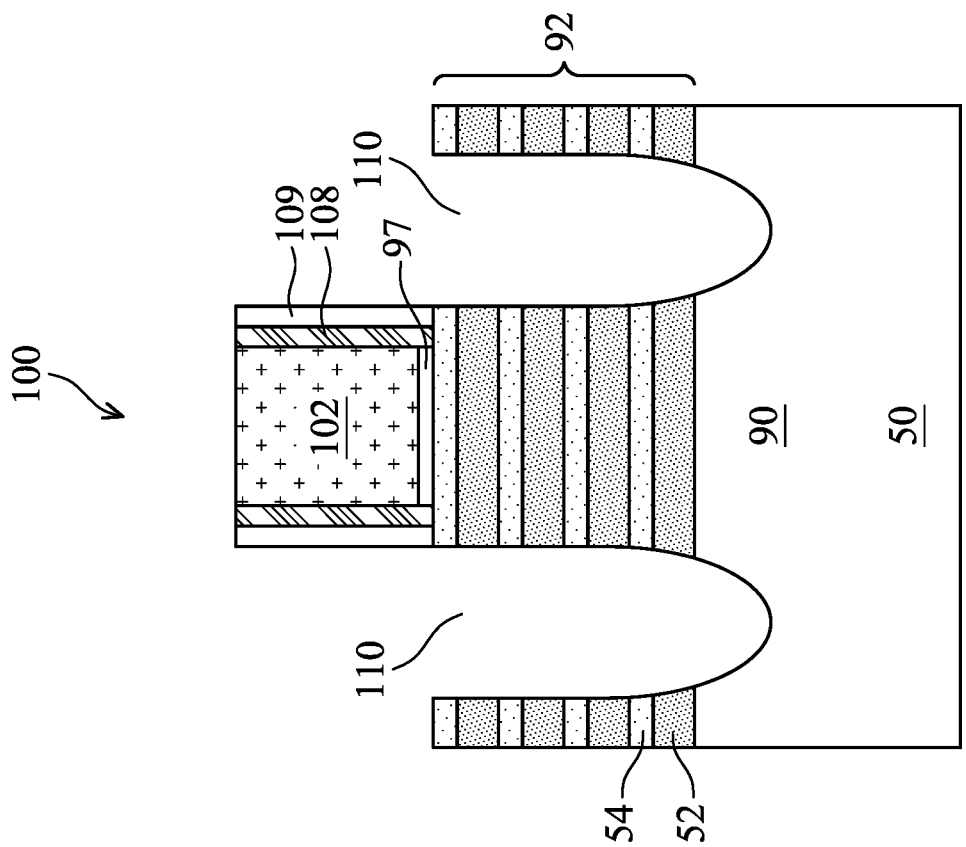

Next, in FIG. 7, openings 110 (may also be referred to as recesses, or source/drain openings) are formed in the layer stack 92. The openings 110 may extend through the layer stack 92 and into the semiconductor fin 90. The openings 110 may be formed by any acceptable etching technique, using, e.g., the dummy gate 102 and the gate spacers 107 as an etching mask. The openings 110 exposes end portions of the first semiconductor material 52 under the dummy gate 102 and exposes end portions of the second semiconductor material 54 under the dummy gate 102.

Figure 8:
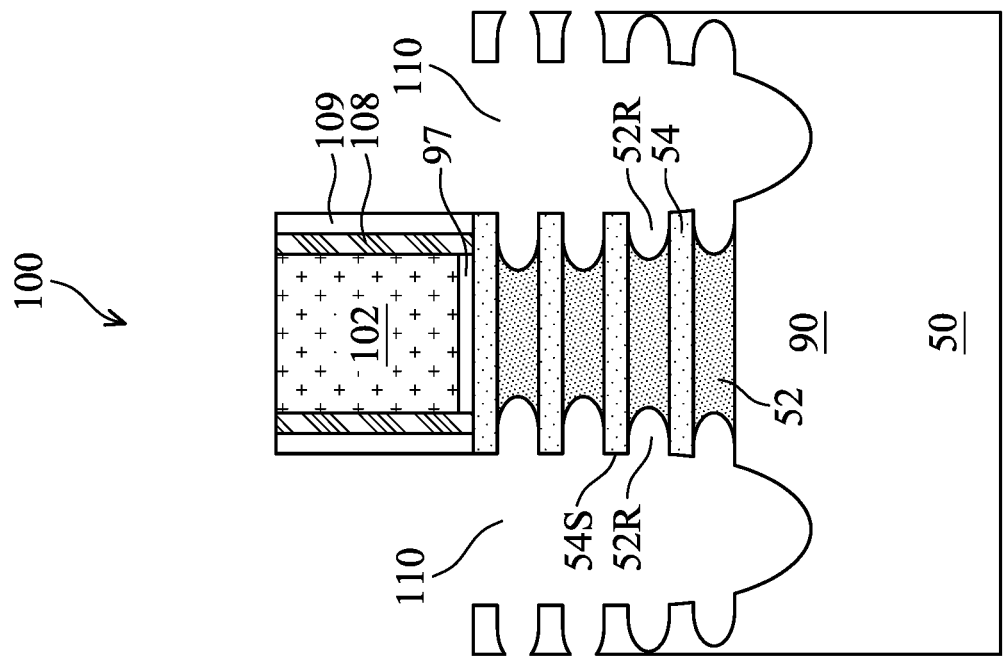

Next, in FIG. 8, after the openings 110 are formed, a selective etching process (e.g., a wet etch process using an etching chemical) is performed to recess end portions of the first semiconductor material 52 exposed by the openings 110 without substantially attacking the second semiconductor material 54. After the selective etching process, recesses 52R are formed in the first semiconductor material 52 at locations where the removed end portions used to be. Note that due to the recesses 52R, sidewalls of the first semiconductor material 52 are recessed from respective sidewalls 54S of the second semiconductor material 54, and therefore, the recesses 52R may also be referred to as sidewall recesses 52R.

FIGS. 9-15 illustrate the formation of a multi-layer spacer film 59 that fills the sidewall recesses 52R. The multi-layer spacer film 59 includes a first dielectric layer 55 and a second dielectric layer 57 different from the first dielectric layer 55. Details are discussed below.

Figure 9:
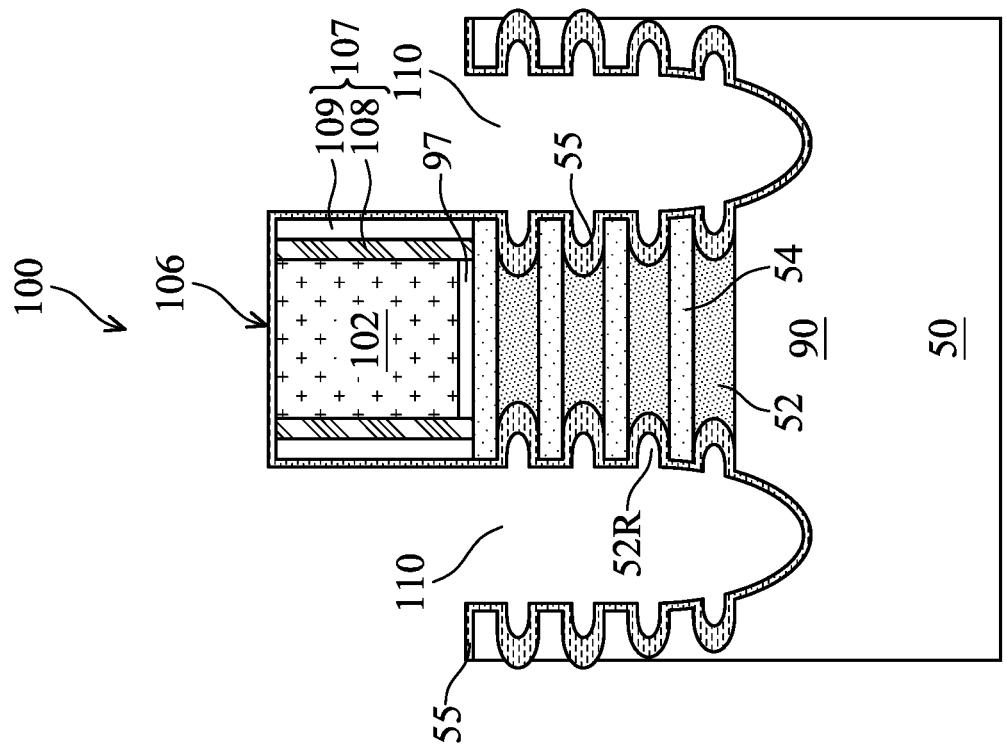

Referring next to FIG. 9, the first dielectric layer 55 is formed conformally over the dummy gate structure 106, along sidewalls of the gate spacers 107, in the openings 110, and in the sidewall recesses 52R. In the illustrated embodiment, the first dielectric layer 55 is formed of a dielectric material, such as silicon oxycarbide (SiOC), silicon oxycarbonitride (SiOCN), or the like. The first dielectric layer 55 (also referred to as a first spacer layer) may be formed by a highly conformal deposition method, such as atomic layer deposition (ALD). For example, a thermal ALD process may be performed at a temperature between about 500° C. and about 700° C. to form the first dielectric layer 55. As another example, a plasma-enhanced ALD (PEALD) process may be performed at a temperature between about 200° C. and about 300° C. to form the first dielectric layer 55. The thermal ALD or the PEALD deposition processes may achieve a conformity higher than about 95% when forming the first dielectric layer 55. As illustrated in FIG. 9, the first dielectric layer 55 lines the sidewall recess 52R, and lines the sidewalls and the bottoms of the openings 110.

In some embodiments, the first dielectric layer 55 has a dielectric constant between about 3.7 and about 4.5. A density of the first dielectric layer 55 may be between about 2.0 g/cm$^3$ and about 6 g/cm$^3$. In some embodiments, the first dielectric layer 55 is a carbon-rich layer to provide good etch resistance in subsequent processing. For example, an atomic percentage of carbon in the first dielectric layer 55 is larger than about 5 atomic percentage (at %), such as between about 5 at % and about 20 at %. The disclosed range of atomic percentage of carbon (e.g., between about 5 at % and about 20 at %) provides good etch resistance against a wide variety of etchants (e.g., diluted HF (dHF), $H_3PO_4$, a mixture of $H_2O_2$ and $SC_2$, or a mixture of $NF_3$ and $F_2$) while keeping the dielectric constant low. If the atomic percentage of carbon is smaller than about 5 at %, then the etch resistance property of the first dielectric layer 55 may degrade below a target level of resistance. On the other hand, if the atomic percentage of carbon is larger than about 20 at %, the dielectric constant of the first dielectric layer 55 may be too high (e.g., larger than about 4.5), which may increase the parasitic capacitance.

Figure 10:
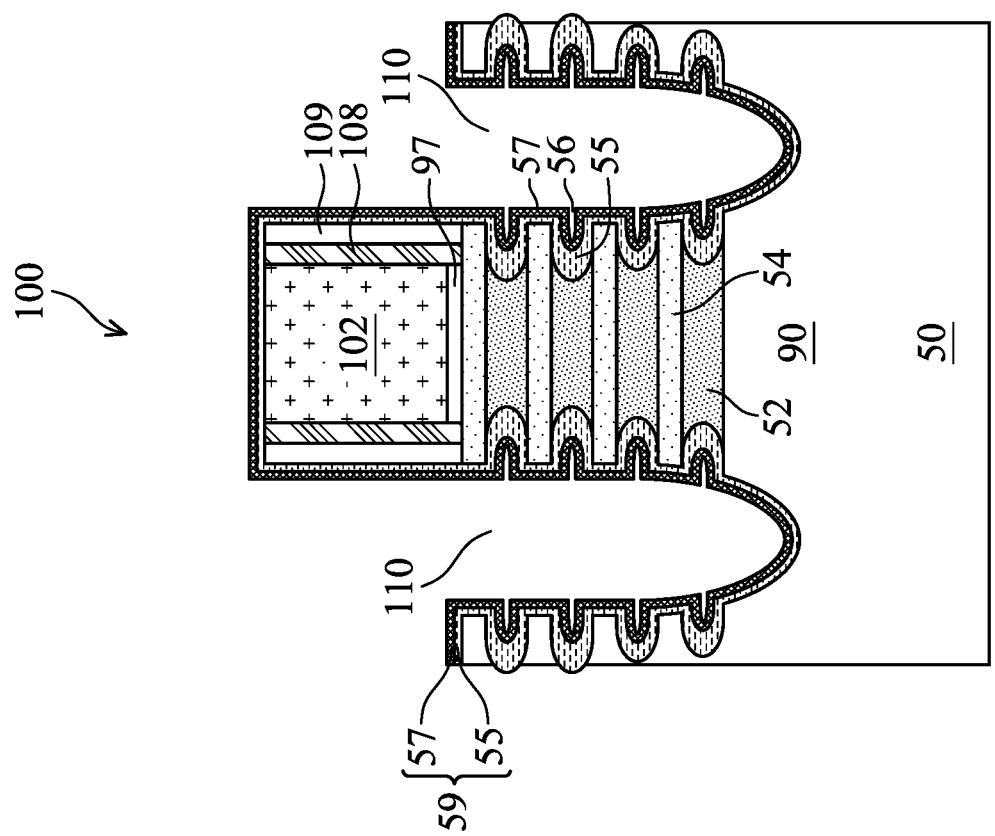
Figure 11:
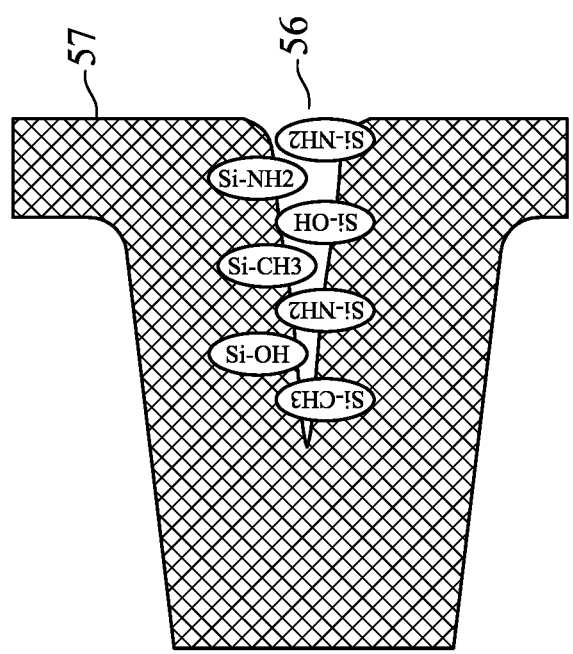

Next, in FIG. 10, a second dielectric layer 57 is formed conformally over the first dielectric layer 55. The second dielectric layer 57 is formed of a dielectric material, such as silicon nitride (SiN), silicon carbonitride (SiCN), silicon oxynitride (SiON), silicon oxycarbonitride (SiOCN), or the like. The second dielectric layer 57 (also referred to as a second spacer layer) may be formed by a highly conformal deposition method such as ALD. For example, a thermal ALD process with a conformity larger than 99% may be performed to form the second dielectric layer 57. As illustrated in FIG. 10, the second dielectric layer 57 extends along the first dielectric layer 55, lines the sidewall recesses 52R, and lines the sidewalls and the bottoms of the openings 110. The first dielectric layer 55 and the second dielectric layer 57 are collectively referred to as a multi-layer spacer film 59 in the discussion herein. Notably, in FIG. 10, the multi-layer spacer film 59 does not completely fill the sidewall recesses 52R (see FIG. 9). Instead, a seam 56 (e.g., an air gap) may exist in each sidewall recess 52R, due to, e.g., the high-aspect ratio of the sidewall recess 52R in advanced processing nodes and the difficulty in filling high-aspect ratio openings. The sizes of the seams 56 in FIG. 10 may be exaggerated to clearly show the seams 56.

In some embodiments, the second dielectric layer 57 has a dielectric constant between about 3.0 and about 4.2. A density of the second dielectric layer 57 may be between about 1.0 g/cm$^3$ and about 2.5 g/cm$^3$. In the illustrated embodiment, the dielectric constant of the first dielectric layer 55 is higher than or equal to the dielectric constant of the second dielectric layer 57. In addition, the density of the first dielectric layer 55 is higher than the density of the second dielectric layer 57, in some embodiments. The higher dielectric constant and/or the higher density of the first dielectric layer 55 is chosen to achieve higher etch resistance, such that in a subsequent etching processing to remove the first semiconductor material 52 (see FIG. 18), the first dielectric layer 55 and the second dielectric layer 57 would not be etched through to expose the source/drain regions 112, thereby avoiding electrical short between subsequently formed replacement gate structure 123 (see FIG. 19) and the source/drain regions 112. More details are discussed hereinafter.

FIGS. 11-13 illustrate a multi-step annealing process to remove the seams 56, in an embodiment. For simplicity, FIGS. 11-13 only show a portion of the second dielectric layer 57 in a sidewall recess 52R. A two-step annealing process is described below with reference to FIGS. 11-14.

Referring now to FIG. 11, which shows a zoomed-in view of a portion of the second dielectric layer 57 in a sidewall recess and a corresponding seam 56 in FIG. 10. FIG. 11 further illustrates the different bonds between silicon atoms and different function groups in the material of the second dielectric layer 57. For example, FIG. 11 shows bonds between silicon atoms and the hydroxyl group (e.g., —OH group), the amine group (e.g., —NH$_2$ group), and the methyl group (e.g., —CH$_3$ group).

Next, in FIG. 12, the first step of the two-step annealing process, referred to as a first annealing process 62, is performed. In some embodiments, the first annealing process 62 is performed using a gas source comprising water vapor (e.g., H$_2$O vapor), and therefore, may also be referred to as a H$_2$O annealing process. The water vapor is supplied to be in contact with the second dielectric layer 57. A temperature of the first annealing process 62 may be between about 300° C. and about 550° C. The chemical reactions in the first annealing process may be described by the following chemical equations:

$$Si—NH_2 + H_2O \rightarrow NH_3 + Si—OH \quad (1)$$

$$Si—CH_3 + H_2O \rightarrow CH_4 + Si—OH \quad (2)$$

It is seen from the chemical equations (1) and (2) that during the first annealing process 62, some of the —NH$_2$ functional groups and the —CH$_3$ functional groups in the second dielectric layer 57 are replaced by the —OH functional groups to form Si—OH bonds. Volatile products, such as ammonia ($NH_3$) and methane ($CH_4$), are formed and are released (e.g., as gases) from the second dielectric layer 57. The release of $NH_3$ and $CH_4$ from the second dielectric layer 57 is also referred to as a degassing process. Since oxygen atoms are larger than nitrogen atoms and carbon atoms, replacing the —$NH_2$ functional groups and the —$CH_3$ functional groups with the —OH functional groups causes the volume of (e.g., the amount of space taken by) the second dielectric layer 57 to increase, in some embodiments. In other words, the volume of the second dielectric layer 57 is increased after the first annealing process 62, which reduces the size of the seam 56. In the example of FIG. 12, the seam 56, although reduced in size, is not completely removed (e.g., closed) after the first annealing process 62.

Next, in FIG. 13, the second step of the two-step annealing process, referred to as a second annealing process 66, is performed. In some embodiments, the second annealing process 66 is performed using a gas source comprising nitrogen gas (e.g., $N_2$), and therefore, may also be referred to as a $N_2$ annealing process. The nitrogen gas is supplied to be in contact with the second dielectric layer 57. A temperature of the second annealing process 66 may be between about 400° C. and about 600° C. In some embodiments, after the second annealing process 66, the second dielectric layer 57 has hydrophobic surfaces, e.g., due to the chemical reactions induced by the annealing processes, which improves the etch resistance of the second dielectric layer 57.

FIG. 14 illustrates the chemical reactions in the second annealing process 66. The high temperature of the second annealing process 66 breaks some of the bonds between the —OH functional groups and the H—O—H functional groups, and the H—O—H functional groups leaves (e.g., is released from) the second dielectric layer 57 as water vapor. In addition, two adjacent Si—OH bonds may form a cross-link (e.g., Si—O—Si) and releases an H—O—H functional group as water vapor due to the cross-linking. Therefore, the second annealing process 66 functions to de-moisturize the second dielectric layer 57 and to form cross-links (e.g., Si—O—Si) in the second dielectric layer 57. As illustrated in FIG. 13, after the second annealing process 66, the seam 56 is closed (also referred to as being removed from the second dielectric layer 57). In FIG. 13, details of the molecular structure of the second dielectric layer 57 in areas previously occupied by the seam 56 are shown at the top right corner and pointed to by the arrow in FIG. 13. It is seen that some —$NH_2$ functional groups may still remain in the second dielectric layer 57 after the second annealing process 66.

Figure 15:
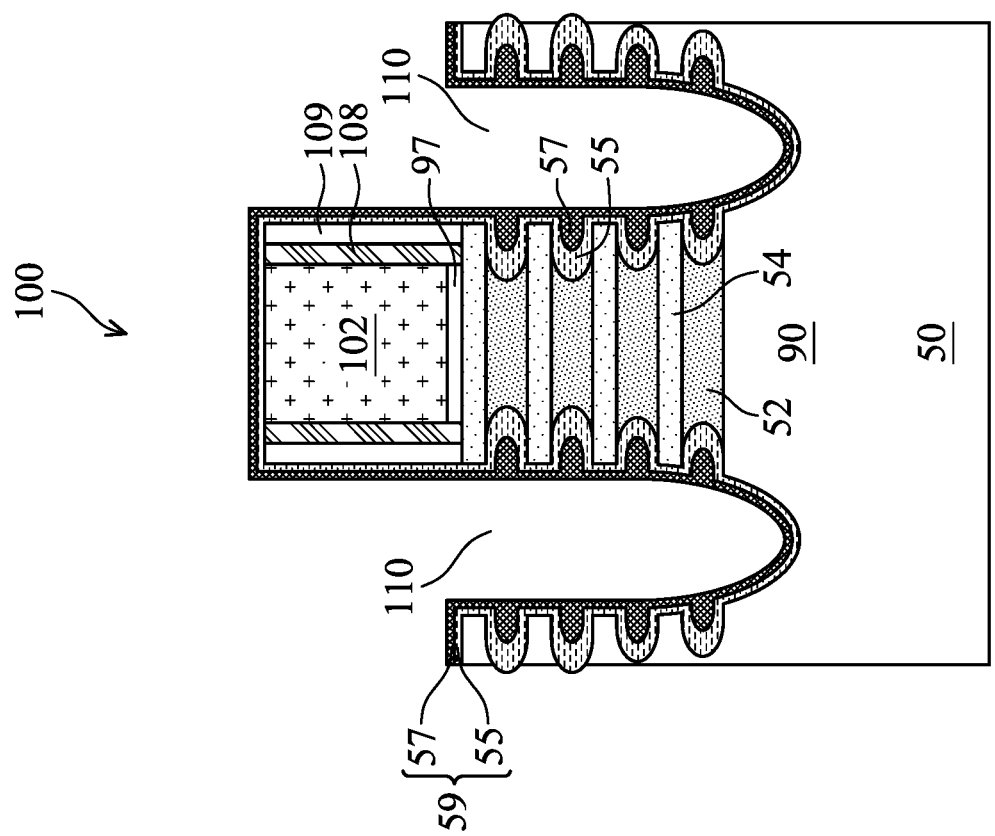

FIG. 15 shows the NSFET device 100 after the multi-step annealing process described above. As illustrated in FIG. 15, the multi-layer spacer film 59, which comprises the first dielectric layer 55 and the second dielectric layer 57, completely fills the sidewall recesses 52R (see FIG. 8).

Figure 16:
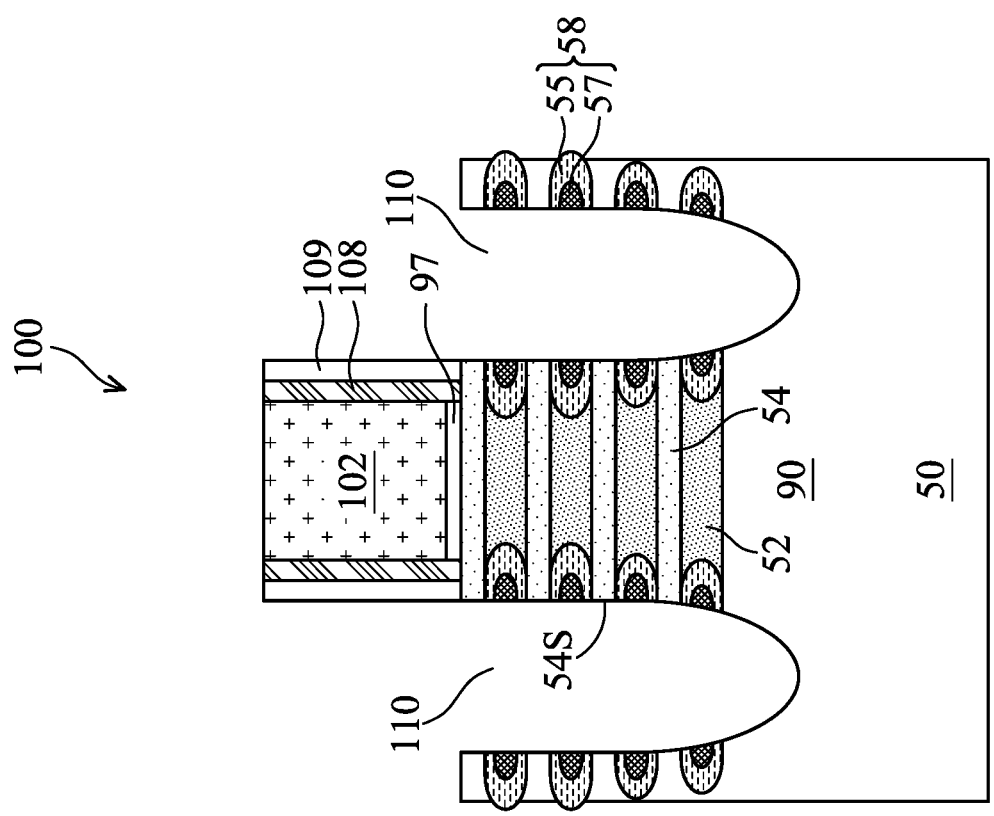

Next, in FIG. 16, a trimming process (also referred to an inner-spacer trimming process) is performed to remove (e.g., completely remove) portions of the multi-layer spacer film 59 disposed outside the sidewall recesses 52R, such as portions along sidewalls and bottoms of the openings 110 and portions along the upper surface of the dummy gate 102. After the trimming process, remaining portions of the multi-layer spacer film 59 inside the sidewall recesses 52R form inner spacers 58.

In some embodiments, the trimming process is a suitable etching process, such as a dry etch process or a wet etch process. In an example embodiment, a dry etch process using a gas source comprising a mixture of $CHF_3$ and $O_2$, a mixture of $CF_4$ and $O_2$, a mixture of $NF_3$, $CH_3F$, and $CHF_3$, or the like, is performed to remove portions of the multi-layer spacer film 59 disposed outside the sidewall recesses 52R. Parameters of the dry etch process, such as the mixing ratio between the gases in the gas source, the pressure, and/or the flow rates of the gases, are tuned to adjust a lateral etching rate of the dry etch process. In the example of FIG. 16, after the trimming process, sidewalls of the remaining portions of the multi-layer spacer film 59 are flush with the sidewalls 54S of the second semiconductor material 54. In some embodiments, sidewalls of the remaining portions of the multi-layer spacer film 59 are recessed from the sidewalls 54S of the second semiconductor material 54, or extend toward the openings 110 beyond the sidewalls 54S of the second semiconductor material 54. These and other variations are fully intended to be included within the scope of the present disclosure. After the trimming process, the remaining portions of the first dielectric layer 55 and the remaining portions of the second dielectric layer 57 in the sidewall recesses 52R form inner spacers 58. In some embodiments, an average dielectric constant of the inner spacers 58 is between about 3.7 and about 4.5.

Figure 17:
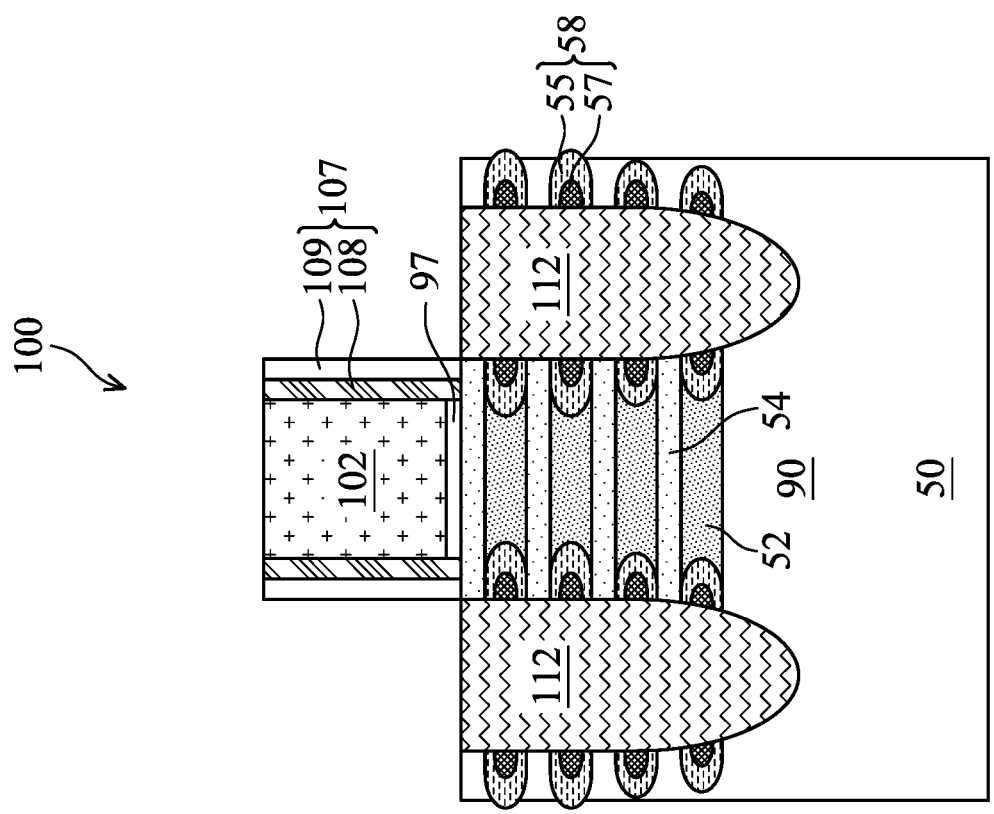

Next, in FIG. 17, an etching process, which may be a pre-cleaning process for the subsequent epitaxial process to form the source/drain regions 112, is performed. Next, source/drain regions 112 are formed in the openings 110. As illustrated in FIG. 17, the source/drain regions 112 fill the openings 110.

In some embodiments, the source/drain regions 112 are formed of an epitaxial material(s), and therefore, may also be referred to as epitaxial source/drain regions 112. In some embodiments, the epitaxial source/drain regions 112 are formed in the openings 110 to exert stress in the respective channel regions of the NSFET device 100 formed, thereby improving performance. The epitaxial source/drain regions 112 are formed such that the dummy gate 102 is disposed between neighboring pairs of the epitaxial source/drain regions 112. In some embodiments, the gate spacers 107 are used to separate the epitaxial source/drain regions 112 from the dummy gate 102 by an appropriate lateral distance so that the epitaxial source/drain regions 112 do not short out subsequently formed gate of the resulting NSFET device.

The epitaxial source/drain regions 112 are epitaxially grown in the openings 110, in some embodiments. The epitaxial source/drain regions 112 may include any acceptable material, such as appropriate for n-type or p-type device. For example, when n-type devices are formed, the epitaxial source/drain regions 112 may include materials exerting a tensile strain in the channel regions, such as silicon, SiC, SiCP, SiP, or the like. Likewise, when p-type devices are formed, the epitaxial source/drain regions 112 may include materials exerting a compressive strain in the channel regions, such as SiGe, SiGeB, Ge, GeSn, or the like. The epitaxial source/drain regions 112 may have surfaces raised from respective surfaces of the fins and may have facets.

The epitaxial source/drain regions 112 and/or the fins may be implanted with dopants to form source/drain regions, similar to the process previously discussed for forming lightly-doped source/drain regions, followed by an anneal. The source/drain regions may have an impurity concentration of between about $10^{19}$ $cm^{-3}$ and about $10^{21}$ $cm^{-3}$. The n-type and/or p-type impurities for source/drain regions may be any of the impurities previously discussed. In some embodiments, the epitaxial source/drain regions 112 may be in situ doped during growth.

As a result of the epitaxy processes used to form the epitaxial source/drain regions 112, upper surfaces of the epitaxial source/drain regions 112 have facets which expand laterally outward beyond sidewalls of the fin 90. In some embodiments, adjacent epitaxial source/drain regions 112 disposed over adjacent fins remain separated after the epitaxy process is completed. In other embodiments, these facets cause adjacent epitaxial source/drain regions 112 disposed over adjacent fins of a same NSFET to merge.

Figure 18:
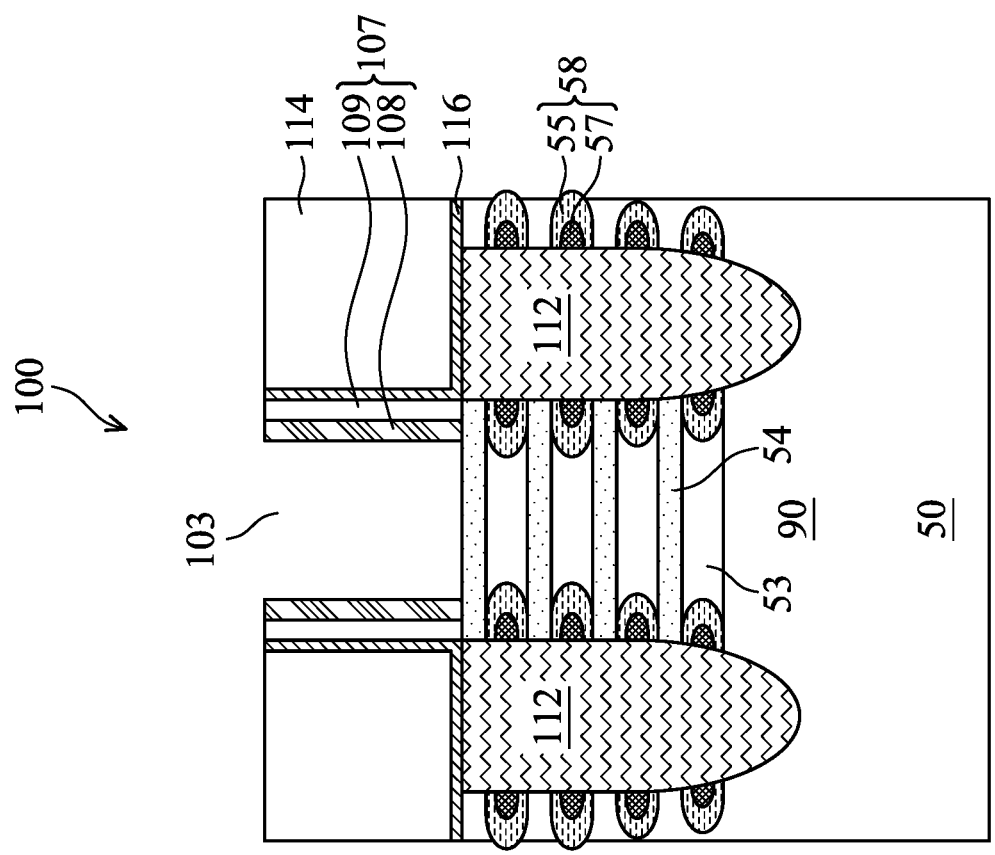

Next, in FIG. 18, a contact etch stop layer (CESL) 116 is formed (e.g., conformally) over the source/drain regions 112 and over the dummy gate 102, and a first inter-layer dielectric (ILD) 114 is then deposited over the CESL 116. The CESL 116 is formed of a material having a different etch rate than the first ILD 114, and may be formed of silicon nitride using PECVD, although other dielectric materials such as silicon oxide, silicon oxynitride, combinations thereof, or the like, and alternative techniques of forming the CESL 116, such as low pressure CVD (LPCVD), PVD, or the like, could be used.

The first ILD 114 may be formed of a dielectric material, and may be deposited by any suitable method, such as CVD, plasma-enhanced CVD (PECVD), or FCVD. Dielectric materials for the first ILD 114 may include silicon oxide, Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used.

Next, the dummy gate 102 is removed. To remove the dummy gate 102, a planarization process, such as a CMP, may be performed to level the top surfaces of the first ILD 114 and CESL 116 with the top surfaces of the dummy gate 102 and gate spacers 107. The planarization process may also remove the masks 104 (see FIG. 5A) on the dummy gates 102 (if the mask 104 has not been removed by the anisotropic etching process to form the gate spacers 107), and portions of the gate spacers 107 along sidewalls of the masks 104. After the planarization process, top surfaces of the dummy gate 102, gate spacers 107, and first ILD 114 are level. Accordingly, the top surface of the dummy gate 102 is exposed at the upper surface of the first ILD 114.

After the planarization process, the dummy gate 102 and the dummy gate dielectric 97 are removed in an etching step(s), so that a recess 103 (may also be referred to as an opening 103) is formed between the gate spacers 107. In some embodiments, the dummy gate 102 is removed by an anisotropic dry etch process. For example, the etching process may include a dry etch process using reaction gas(es) that selectively etch the dummy gate 102 without etching the first ILD 114 or the gate spacers 107. During the removal of the dummy gate 102, the dummy gate dielectric 97 may be used as an etch stop layer when the dummy gate 102 is etched. The dummy gate dielectric 97 may then be removed after the removal of the dummy gate 102. The recess 103 exposes the channel regions of the NSFET. The channel regions are disposed between neighboring pairs of the epitaxial source/drain regions 112. After removal of the dummy gate 102 and the dummy gate dielectric 97, the first semiconductor material 52 and the second semiconductor material 54 that were disposed under the dummy gate 102 are exposed by the recess 103.

Next, the first semiconductor material 52 is removed to release the second semiconductor material 54. After the first semiconductor material 52 is removed, the second semiconductor material 54 forms a plurality of nanostructures 54 that extend horizontally (e.g., parallel to a major upper surface of the substrate 50). The nanostructures 54 may be collectively referred to as the channel regions or the channel layers of the NSFET device 100 formed. As illustrated in FIG. 18, gaps 53 (e.g., empty spaces) are formed between the nanostructures 54 by the removal of the first semiconductor material 52. Depending on the shape and/or the dimension of the nanostructures 54, the nanostructures 54 may also be referred to as nanowires or nanosheets, and the NSFET device 100 may also be referred to as a gate-all-around (GAA) device, in some embodiments.

In some embodiments, the first semiconductor material 52 is removed by a selective etching process using an etchant that is selective to (e.g., having a higher etch rate for) the first semiconductor material 52, such that the first semiconductor material 52 is removed without attacking the second semiconductor material 54. In an embodiment, an isotropic etching process is performed to remove the first semiconductor material 52. The isotropic etching process may be performed using an etching gas, and optionally, a carrier gas. In some embodiments, the etching gas comprises HF, a mixture of $F_2$ and HF, or the like, and the carrier gas may be an inert gas such as Ar, He, $N_2$, combinations thereof, or the like. In some embodiments, an etchant such as dissolved ozone in de-ionized water (DIO) is used to selectively remove the first semiconductor material 52.

Advantages of the present disclosure are discussed now. As feature sizes continue to shrink in advanced processing nodes, reducing the parasitic capacitance of the device plays an important role in improving the device performance. While low-k materials (e.g., material having a low dielectric constant value, such as smaller than about 3.0) may be used to lower the parasitic capacitance, low-k materials generally have low etch resistance. For the NSFET device 100, it is advantageous to form the inner spacers 58 with low dielectric constant for reducing parasitic capacitance. At the same time, the inner spacer 58 should have high etch resistance so that in the etching process to form the recess 103, the inner spacers 58 would not be etched through to expose the source/drain regions 112. Otherwise, electrical short may occur between the source/drain regions 112 and the subsequently formed replacement gate structure 123 (see FIG. 19).

By filling the sidewall recesses 52R with the multi-layer spacer film 59, the disclosed embodiments achieve a balance between dielectric constant and etch resistance. For example, the first dielectric layer 55, which is exposed to the etching chemicals used in the etching process to form the recess 103, is formed of a dielectric material having a relatively high dielectric constant and a relatively high density, which provides good etch resistance to prevent or reduce the possibility of being etched through. At the same time, the second dielectric layer 57 is formed of a dielectric material having a lower dielectric constant, such that the overall (e.g., average) dielectric constant of the inner spacer 58 is still low (e.g., between about 3.7 and about 4.5).

Another advantage of using the multi-layer spacer film 59 to fill the sidewall recesses 52R, compared with a reference design where a single layer dielectric material is used to fill the sidewall recesses 52R, is that the inner spacers 58 formed is seam-less (e.g., do not have seams 56). In advanced processing nodes, it is increasingly difficult to completely fill openings (e.g., sidewall recesses 52R), especially openings with high aspect-ratios. Without the presently disclosed methods, the inner spacers formed by a single layer dielectric material may have seams (e.g., 56). The seams greatly increase the possibility of electrical short between the source/drain regions 112 and the subsequently formed gate stack 123, because once the etching process for forming the recess 103 exposes the seams in the inner spacers, the electrically conductive material of the gate stack 123 may fill the seams and form conductive channels that connect the gate stack 123 with the source/drain regions 112. In other words, without the seams, the etching process would have to etch through a larger lateral distance in the inner spacers 58 to expose the source/drain regions 112; but with the seams, the etching process only needs to expose the seams to cause electrical short. The disclosed methods, by forming the second dielectric layer 57 with a high conformity (e.g., >99%) deposition method, achieves improved gap fill capability to better fill the sidewall recess 52R. In addition, the multi-step annealing process, through expansion of the second dielectric layer 57 and cross-linking, among others features, removes the seams 56 and achieves seam-less inner spacers 58, which greatly reduces the possibility of electrical short between the source/drain regions 112 and the gate stack 123. Furthermore, the surfaces of the second dielectric layer 57 after the annealing processes are hydrophobic, which further increases the etch resistance of the inner spacer 58.

Figure 19:
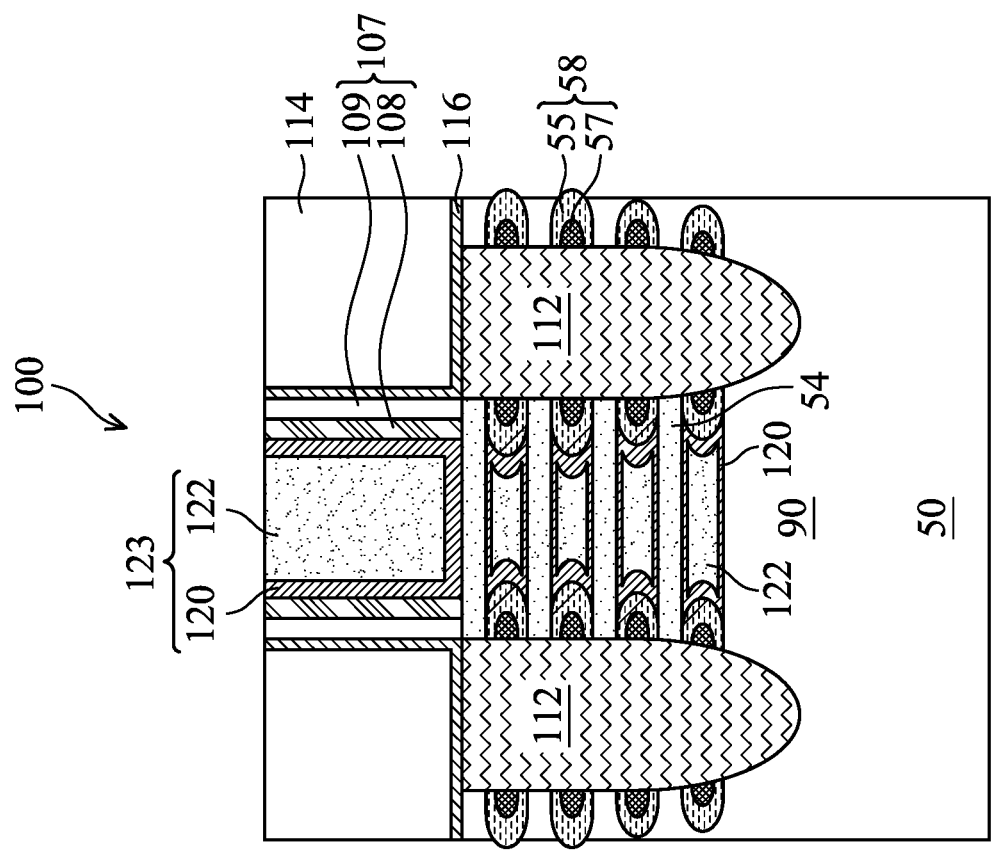

Next, in FIG. 19, a gate dielectric layer 120 is formed (e.g., conformally) in the recess 103 and in the gaps 53. The gate dielectric layer 120 wraps around the nanostructures 54, lines sidewalls of the inner spacers 58 and sidewalls of the gate spacers 107, and extends along the upper surface and sidewalls of the fin 90. In accordance with some embodiments, the gate dielectric layer 120 comprises silicon oxide, silicon nitride, or multilayers thereof. In some embodiments, the gate dielectric layer 120 includes a high-k dielectric material, and in these embodiments, the gate dielectric layer 120 may have a dielectric constant greater than about 7.0, and may include a metal oxide or a silicate of Hf, Al, Zr, La, Mg, Ba, Ti, or Pb, or combinations thereof. The formation methods of the gate dielectric layer 120 may include Molecular-Beam Deposition (MBD), ALD, PECVD, and the like.

Next, a gate electrode material (e.g., an electrically conductive material) is formed in the recess 103 and gaps 53 to form the gate electrode 122. The gate electrode 122 fills the remaining portions of the recess 103 and the gaps 53. The gate electrode 122 may be made of a metal-containing material such as Cu, Al, W, the like, combinations thereof, or multi-layers thereof, and may be formed by, e.g., electroplating, electroless plating, or other suitable method. After the filling of the gate electrodes 122, a planarization process, such as CMP, may be performed to remove excess portions of the gate dielectric layer 120 and the gate electrode material, which excess portions are over the top surface of the first ILD 114. The remaining portions of gate electrode material and the gate dielectric layer 120 thus form the replacement gate structure of the resulting NSFET device 100. The gate electrode 122 and the gate dielectric layer 120 may be collectively referred to as a gate stack 123, a replacement gate structure 123, or a metal gate structure 123. Each gate stack 123 extends over and around the respective nanostructures 54.

Although the gate electrode 122 is illustrated as a single layer in FIG. 19 for simplicity, one skilled in the art will readily appreciate that the gate electrode 122 may have a multi-layered structure and may include a plurality layers, such as a barrier layer, a work function layer, a seed layer and a fill metal.

For example, a barrier layer may be formed conformally over the gate dielectric layer 120. The barrier layer may comprise an electrically conductive material such as titanium nitride, although other materials, such as tantalum nitride, titanium, tantalum, or the like, may alternatively be utilized. A work function layer may be formed over the barrier layer. Exemplary p-type work function materials (may also be referred to as p-type work function metals) include TiN, TaN, Ru, Mo, Al, WN, $ZrSi_2$, $MoSi_2$, $TaSi_2$, $NiSi_2$, other suitable p-type work function materials, or combinations thereof. Exemplary n-type work function materials (may also be referred to as n-type work function metals) include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the work function layer is chosen to tune its work function value so that a target threshold voltage $V_{TH}$ is achieved in the device that is to be formed. Next, a seed layer may be formed over the work function layer. The seed layer may be formed of tungsten, copper, or copper alloys, although other suitable materials may alternatively be used. Once the seed layer has been formed, the fill metal may be formed onto the seed layer, filling the openings 103 and gaps 53. The fill metal may comprise tungsten, although other suitable materials such as aluminum, copper, tungsten nitride, rhuthenium, silver, gold, rhodium, molybdenum, nickel, cobalt, cadmium, zinc, alloys of these, combinations thereof, or the like, may alternatively be utilized.

Additional processing may be performed to finish fabrication of the NSFET device 100, as one of ordinary skill readily appreciates, thus details may not be repeated here. For example, a second ILD may be deposited over the first ILD 114. Further, gate contacts and source/drain contacts may be formed extending through the second ILD and/or the first ILD 114 to electrically couple to the gate stack 123 and the source/drain regions 112, respectively.

Figure 20:
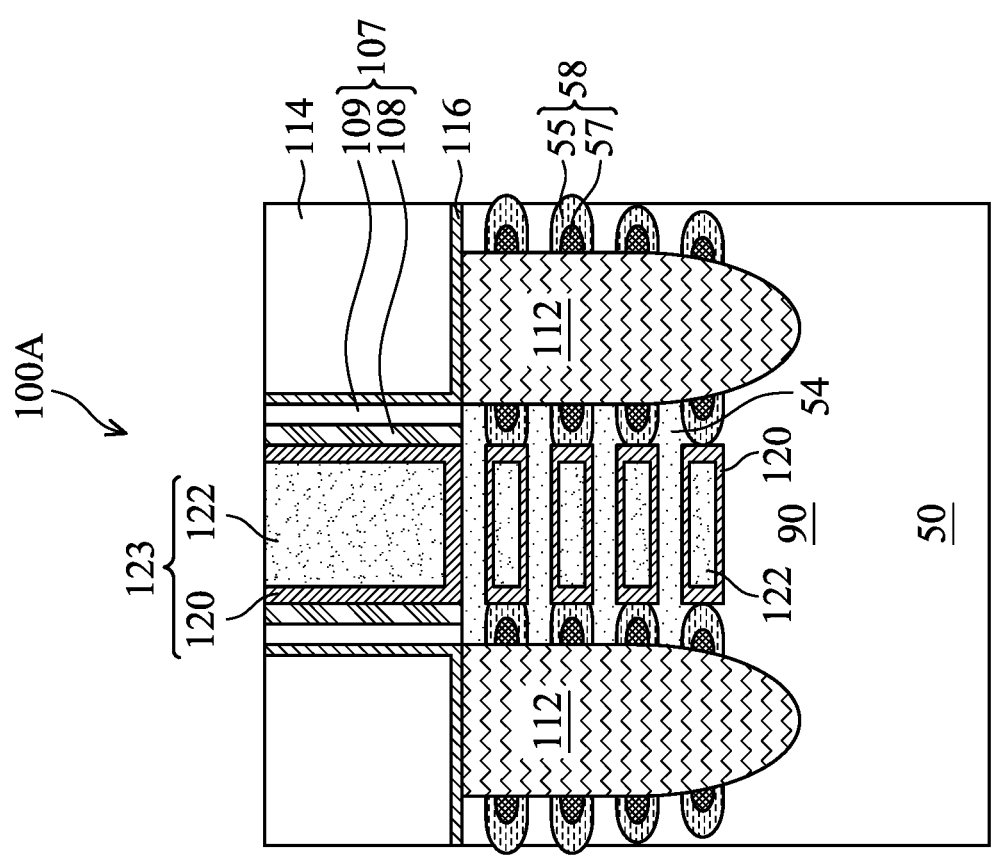
FIG. 20 illustrates a cross-sectional view of a nanostructure field-effect transistor (NSFET) device, in accordance with another embodiment.

FIG. 20 illustrates a cross-sectional view of a nanostructure field-effect transistor (NSFET) device 100A, in accordance with another embodiment. The NSFET device 100A is similar to the NSFET device 100 of FIG. 19, but during the etching process to form the recess 103, portions of the exposed first dielectric layer 55 is removed by the etching process. As a result, the inner surface of the first dielectric layer 55 of each inner spacer 58 facing the gate electrode 122 has a different shape from that in FIG. 19. For example, the inner surface of the first dielectric layer 55 of each inner spacer 58 in FIG. 19 is a curved surface and protrudes toward the gate electrode 122. In the example of FIG. 20, the inner surface of the first dielectric layer 55 of each inner spacer 58 has a straight sidewall that extends parallel to the gate electrode 122.

Figure 21:
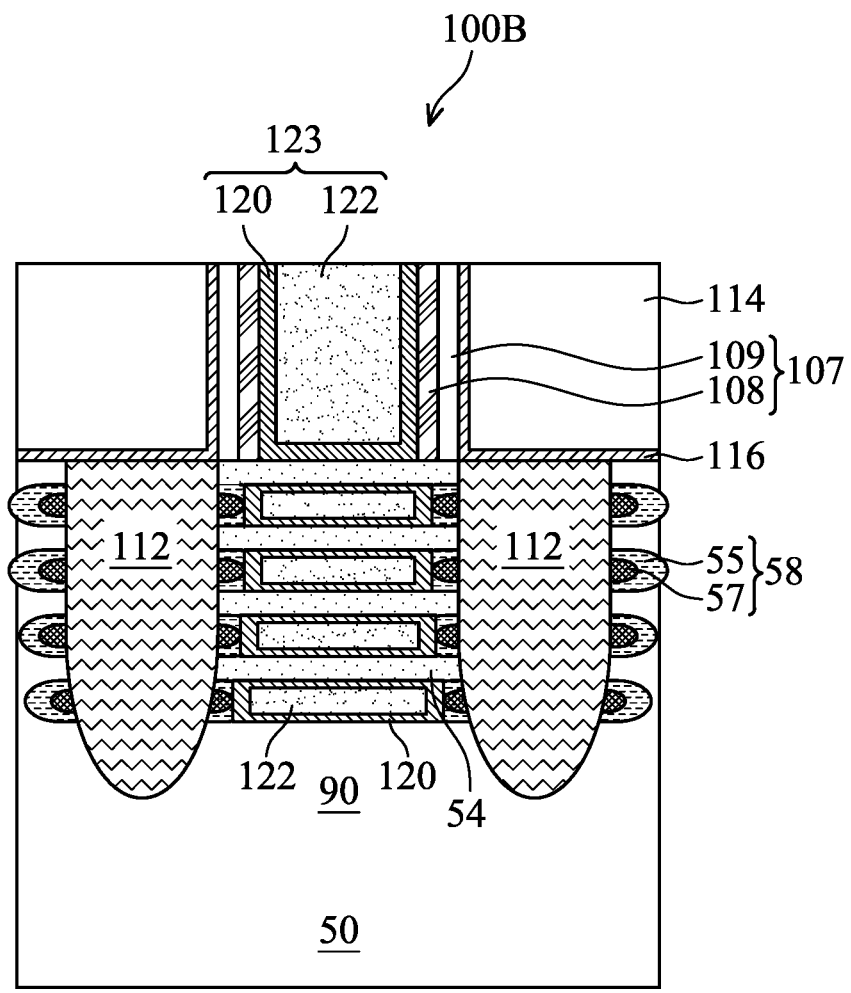
FIG. 21 illustrates a cross-sectional view of a nanostructure field-effect transistor (NSFET) device, in accordance with yet another embodiment.

FIG. 21 illustrates a cross-sectional view of a nanostructure field-effect transistor (NSFET) device 100B, in accordance with yet another embodiment. The NSFET device 100B is similar to the NSFET device 100A of FIG. 20, but during the etching process to form the recess 103, the first dielectric layer 55 is etched through and exposes the second dielectric layer 57. As a result, the gate dielectric layer 120 of the gate stack 123 physically contacts the first dielectric layer 55 and the second dielectric layer 57. Note that due to the seam-less structure of the inner spacers 58, and the increased etch resistance of the second dielectric layer 57 (e.g., due to hydrophobic surfaces), no electrical short occurs and the NSFET device 100B still functions correctly.

Variations of the disclosed embodiments are possible and are fully intended to be included within the scope of the present disclosure. For example, depending on the type of device (e.g., n-type or p-type device) formed, the second semiconductor material 54 may be removed, and the first semiconductor material 52 may remain to form the nanostructures to function as the channel regions of the NSFET device formed. In embodiments where the first semiconductor material 52 remain to form the nanostructures, inner spacers 58 are formed along the end portions of the second semiconductor material 54 before the second semiconductor material 54 is removed, as one of ordinary skill readily appreciates.

Embodiments may achieve advantages. For example, the disclosed methods or structures achieve a good balance between dielectric constant and etch resistance. The inner spacers 58, which include the first dielectric layer 55 and the second dielectric layer 57, are seam-less, have high etch resistance and relatively low overall dielectric constant. As a result, the parasitic capacitance of the NSFET device formed is reduced while still achieving a high level of etch resistance to prevent electrical short between source/drain regions 112 and the gate stack 123.

Figure 22:
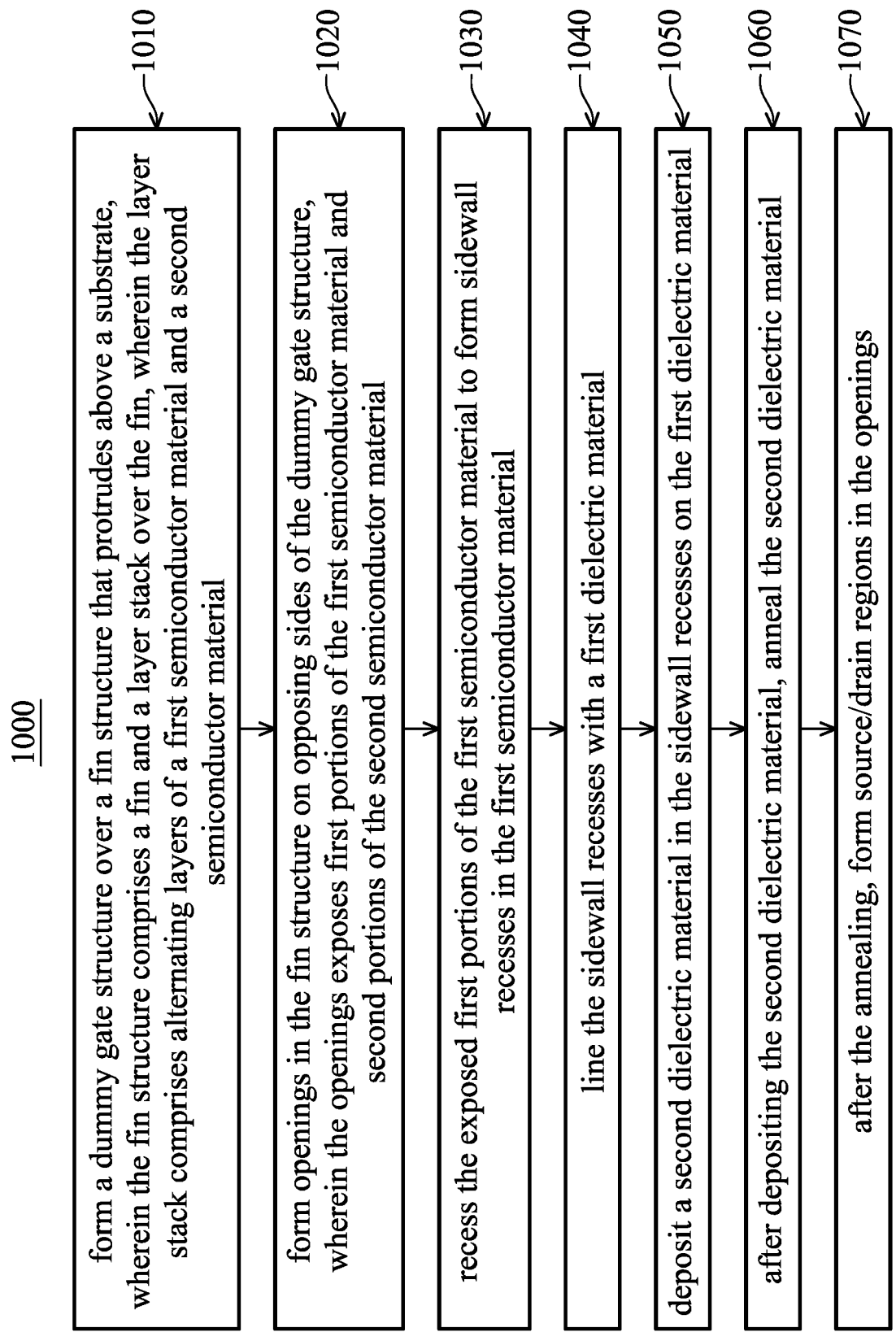
FIG. 22 is a flow chart of a method of forming a semiconductor device, in some embodiments.

FIG. 22 illustrates a flow chart of a method 1000 of fabricating a semiconductor device, in accordance with some embodiments. It should be understood that the embodiment method shown in FIG. 22 is merely an example of many possible embodiment methods. One of ordinary skill in the art would recognize many variations, alternatives, and modifications. For example, various steps as illustrated in FIG. 22 may be added, removed, replaced, rearranged, or repeated.

Referring to FIG. 22, at block 1010, a dummy gate structure is formed over a fin structure that protrudes above a substrate, wherein the fin structure comprises a fin and a layer stack over the fin, wherein the layer stack comprises alternating layers of a first semiconductor material and a second semiconductor material. At block 1020, openings are formed in the fin structure on opposing sides of the dummy gate structure, wherein the openings exposes first portions of the first semiconductor material and second portions of the second semiconductor material. At block 1030, the exposed first portions of the first semiconductor material are recessed to form sidewall recesses in the first semiconductor material. At block 1040, the sidewall recesses are lined with a first dielectric material. At block 1050, a second dielectric material is deposited in the sidewall recesses on the first dielectric material. At block 1060, after depositing the second dielectric material, the second dielectric material is annealed. At block 1070, after the annealing, source/drain regions are formed in the openings.

In an embodiment, a method of forming a semiconductor device includes: forming a dummy gate structure over a fin structure that protrudes above a substrate, wherein the fin structure comprises a fin and a layer stack over the fin, wherein the layer stack comprises alternating layers of a first semiconductor material and a second semiconductor material; forming openings in the fin structure on opposing sides of the dummy gate structure, wherein the openings exposes first portions of the first semiconductor material and second portions of the second semiconductor material; recessing the exposed first portions of the first semiconductor material to form sidewall recesses in the first semiconductor material; lining the sidewall recesses with a first dielectric material; depositing a second dielectric material in the sidewall recesses on the first dielectric material; after depositing the second dielectric material, annealing the second dielectric material; and after the annealing, forming source/drain regions in the openings. In an embodiment, the first dielectric material has a first dielectric constant, and the second dielectric material has a second dielectric constant smaller than the first dielectric constant. In an embodiment, after depositing the second dielectric material and before the annealing, there are air gaps in the sidewall recesses, wherein annealing the second dielectric material removes the air gaps. In an embodiment, after the annealing, a volume of the second dielectric material is increased to fill the air gaps. In an embodiment, annealing the second dielectric material comprises: performing a first annealing process using a first gas source; and after the first annealing process, performing a second annealing process using a second gas source different from the first gas source. In an embodiment, the first gas source comprises water vapor, and the second gas source comprises nitrogen gas. In an embodiment, the first annealing process and the second annealing process are performed at different temperatures. In an embodiment, the first annealing process replaces —$NH_2$ functional groups and —$CH_3$ functional groups in the second dielectric material with —OH functional groups. In an embodiment, the second annealing process forms Si—O—Si cross-links in the second dielectric material. In an embodiment, recessing the exposed first portions of the first semiconductor material comprises performing an etching process using an etchant selective to the first semiconductor material. In an embodiment, the method further includes: after forming the source/drain regions, removing the dummy gate structure to expose the first semiconductor material and the second semiconductor material disposed under the dummy gate structure; selectively removing the exposed first semiconductor material, wherein after selectively removing the exposed first semiconductor material, the second semiconductor material remains and forms a plurality of nanostructures; and forming a replacement gate structure around the plurality of nanostructures. In an embodiment, removing the exposed first semiconductor material comprises performing an etching process, wherein the etching process etches through the first dielectric material and exposes the second dielectric material.

In an embodiment, a method of forming a semiconductor device, includes: forming a first gate structure over a fin structure, wherein the fin structure comprises a fin and a layer stack over the fin, wherein the layer stack comprises layers of a first semiconductor material interleaved with layers of a second semiconductor material; forming source/drain openings in the fin structure on opposing sides of the first gate structure; selectively removing first portions of the first semiconductor material exposed by the source/drain openings to form sidewall recesses in the first semiconductor material; lining the sidewall recesses with a multi-layer spacer film, wherein the multi-layer spacer film comprises a first spacer layer and a second spacer layer that are formed of different materials, wherein after the lining, there are air gaps in the sidewall recesses; performing an annealing process after the lining, wherein the annealing process removes the air gaps in the sidewall recesses; and after the annealing process, forming source/drain regions in the source/drain openings. In an embodiment, the first spacer layer is formed of a first dielectric material, and the second spacer layer is formed of a second dielectric material, wherein a first dielectric constant of the first dielectric material is higher than a second dielectric constant of the second dielectric material. In an embodiment, performing the annealing process comprises: performing a first annealing process using a first gas source; and after the first annealing process, performing a second annealing process using a second gas source different from the first gas source. In an embodiment, a second volume of the second spacer layer after the annealing process is larger than a first volume of the second spacer layer before the annealing process. In an embodiment, the method further includes: after forming the source/drain regions, removing the first gate structure to expose second portions of the first semiconductor material and second portions of the second semiconductor material disposed under the first gate structure; selectively removing the second portions of the first semiconductor material, wherein after selectively removing the second portions of the first semiconductor material, the second portions of the second semiconductor material forms a plurality of nano structures; and forming a replacement gate structure around the plurality of nanostructures.

In an embodiment, a semiconductor device includes: a fin protruding above a substrate; a gate structure over the fin; source/drain regions over the fin on opposing sides of the gate structure; channel layers under the gate structure and between the source/drain regions, wherein the channel layers are substantially parallel to each other, wherein the gate structure surrounds the channel layers; and inner spacers disposed vertically between end portions of adjacent channel layers, and disposed laterally between the gate structure and the source/drain regions, wherein each of the inner spacers comprises a first dielectric layer and a second dielectric layer different from the first dielectric layer. In an embodiment, the first dielectric layer contacts the gate structure, and the second dielectric layer contacts the source/drain regions, wherein a first dielectric constant of the first dielectric layer is higher than a second dielectric constant of the second dielectric layer. In an embodiment, a portion of the gate structure extends through the first dielectric layer and contacts the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:

forming a dummy gate structure over a fin structure that protrudes above a substrate, wherein the fin structure comprises a fin and a layer stack over the fin, wherein the layer stack comprises alternating layers of a first semiconductor material and a second semiconductor material;

forming openings in the fin structure on opposing sides of the dummy gate structure, wherein the openings expose first portions of the first semiconductor material and first portions of the second semiconductor material;

recessing the first portions of the first semiconductor material to form sidewall recesses in the first semiconductor material;

lining the sidewall recesses with a first dielectric material;

depositing a second dielectric material in the sidewall recesses on the first dielectric material, wherein the second dielectric material in a first sidewall recess of the sidewall recesses includes a first portion along an upper surface of the first sidewall recess, a second portion along a lower surface of the first sidewall recess, and a third portion along a sidewall of the first sidewall recess, wherein there is an air gap between the first portion of the second dielectric material and the second portion of the second dielectric material in the first sidewall recess;

after depositing the second dielectric material, annealing the second dielectric material, wherein annealing the second dielectric material removes the air gap;

after the annealing, forming source/drain regions in the openings;

after forming the source/drain regions, removing the dummy gate structure to expose second portions of the first semiconductor material and second portions of the second semiconductor material disposed under the dummy gate structure;

selectively removing the second portions of the first semiconductor material by performing an etching process, wherein the etching process removes a first portion of the first dielectric material and exposes the second dielectric material, wherein after performing the etching process, a first sidewall of a remaining portion of the first dielectric material in the first sidewall recess contacts a respective one of the source/drain regions, and a second opposing sidewall of the remaining portion of the first dielectric material in the first sidewall recess is a straight sidewall, wherein a thickness of the second dielectric material in the first sidewall recess decreases along a lateral direction from the first sidewall toward the second opposing sidewall, wherein after selectively removing the second portions of the first semiconductor material, the second portions of the second semiconductor material remain and form a plurality of nanostructures; and forming a replacement gate structure around the plurality of nanostructures.

2. The method of claim 1, wherein the first dielectric material has a first dielectric constant, and the second dielectric material has a second dielectric constant smaller than the first dielectric constant.

3. The method of claim 1, wherein annealing the second dielectric material comprises:

performing a first annealing process using a first gas source; and after the first annealing process, performing a second annealing process using a second gas source different from the first gas source.

4. The method of claim 3, wherein the first gas source comprises water vapor, and the second gas source comprises nitrogen gas.

5. The method of claim 4, wherein the first annealing process and the second annealing process are performed at different temperatures.

6. The method of claim 3, wherein the first annealing process replaces —$NH_2$ functional groups and —$CH_3$ functional groups in the second dielectric material with —OH functional groups.

7. The method of claim 6, wherein the second annealing process forms Si—O—Si cross-links in the second dielectric material.

8. The method of claim 1, wherein recessing the first portions of the first semiconductor material comprises performing a selective etching process using an etchant selective to the first semiconductor material.

9. The method of claim 1, wherein the first dielectric material comprises carbon, wherein an atomic percentage of carbon in the first dielectric material is between about 5 atomic percentage (at %) and about 20 at %.

10. The method of claim 1, wherein after performing the etching process, the remaining portion of the first dielectric material in the first sidewall recess extends along an upper surface of the second dielectric material facing away from the substrate and along a lower surface of the second dielectric material facing the substrate.

11. A method of forming a semiconductor device, the method comprising:
forming a gate structure over a fin structure, wherein the fin structure comprises a fin and a layer stack over the fin, wherein the layer stack comprises layers of a first semiconductor material interleaved with layers of a second semiconductor material;
forming source/drain openings in the fin structure on opposing sides of the gate structure;
selectively removing first portions of the first semiconductor material exposed by the source/drain openings to form sidewall recesses in the first semiconductor material;
lining the sidewall recesses with a multi-layer spacer film, wherein the multi-layer spacer film comprises a first spacer layer and a second spacer layer that are formed of different materials, wherein after the lining, there are air gaps in the sidewall recesses;
performing an annealing process after the lining, wherein the annealing process removes the air gaps in the sidewall recesses;
after the annealing process, forming source/drain regions in the source/drain openings;
after forming the source/drain regions, removing the gate structure to expose second portions of the first semiconductor material and second portions of the second semiconductor material disposed under the gate structure;
selectively removing the second portions of the first semiconductor material using an etching process, wherein the etching process removes portions of the first spacer layer and exposes the second spacer layer, wherein after the etching process, the second spacer layer in each of the sidewall recesses is interposed between a first remaining portion of the first spacer layer and a second remaining portion of the first spacer layer, a first sidewall of the first remaining portion of the first spacer layer contacts a respective one of the source/drain regions, and a second sidewall of the first remaining portion of the first spacer layer opposing the first sidewall is a straight sidewall, and a thickness of the second spacer layer in each of the sidewall recesses decreases along a direction from the first sidewall toward the second sidewall, wherein after the etching process, the second portions of the second semiconductor material form a plurality of nanostructures; and
forming a replacement gate structure around the plurality of nanostructures.

12. The method of claim 11, wherein the first spacer layer is formed of a first dielectric material, and the second spacer layer is formed of a second dielectric material, wherein a first dielectric constant of the first dielectric material is higher than a second dielectric constant of the second dielectric material.

13. The method of claim 11, wherein performing the annealing process comprises:
performing a first annealing process using a first gas source; and
after the first annealing process, performing a second annealing process using a second gas source different from the first gas source.

14. The method of claim 13, wherein a second volume of the second spacer layer after the annealing process is larger than a first volume of the second spacer layer before the annealing process.

15. The method of claim 13, wherein the first gas source comprises water vapor, and the second gas source comprises nitrogen gas.

16. The method of claim 15, wherein the first annealing process and the second annealing process are performed at different temperatures.

17. A method of forming a semiconductor device, the method comprising:
forming a gate structure over a fin structure, wherein the fin structure protrudes above a substrate, and comprises a fin and a layer stack over the fin, wherein the layer stack comprises alternating layers of a first semiconductor material and a second semiconductor material;
forming source/drain openings in the fin structure adjacent to the gate structure, wherein the source/drain openings expose first portions of the first semiconductor material and first portions of the second semiconductor material that are disposed under the gate structure;
recessing the first portions of the first semiconductor material to form sidewall recesses in the first semiconductor material;
lining the sidewall recesses with a first dielectric material;
forming a second dielectric material in the sidewall recesses on the first dielectric material;
after forming the second dielectric material, performing a first annealing process using a first gas source;
after performing the first annealing process, performing a second annealing process using a second gas source different from the first gas source;
after performing the second annealing process, forming source/drain regions in the source/drain openings;
after forming the source/drain regions, removing the gate structure to expose second portions of the first semiconductor material and second portions of the second semiconductor material;
selectively removing the second portions of the first semiconductor material by performing an etching process, wherein the etching process removes a first portion of the first dielectric material and exposes the second dielectric material, wherein after performing the etching process, a remaining portion of the first dielectric material in each of the sidewall recesses extends along an upper surface of the second dielectric material facing away from the substrate and along a lower surface of the second dielectric material facing the substrate, wherein a first sidewall of the remaining portion of the first dielectric material in each of the sidewall recesses contacts a respective one of the source/drain regions, and a second sidewall of the remaining portion of the first dielectric material opposing the first sidewall is a straight sidewall, wherein a thickness of the second dielectric material in each of the sidewall recesses decreases along a lateral direction from the first sidewall of the remaining portion of the first dielectric material toward the second sidewall of the remaining portion of the first dielectric material, wherein after selectively removing the second portions of the first semiconductor material, the second portions of the second semiconductor material form a plurality of nanostructures; and
forming a replacement gate structure around the plurality of nanostructures.

18. The method of claim 17, wherein after forming the second dielectric material and before performing the first annealing process, the second dielectric material in the sidewall recesses has air gaps, wherein the first annealing process and the second annealing process remove the air gaps.

19. The method of claim 17, wherein the first dielectric material has a higher dielectric constant than the second dielectric material.

20. The method of claim 17, wherein a thickness of the remaining portion of the first dielectric material in each of the sidewall recesses increases along the lateral direction from the first sidewall of the remaining portion of the first dielectric material toward the second sidewall of the remaining portion of the first dielectric material.

\* \* \* \* \*